United States Patent
Kobayashi et al.

(10) Patent No.: US 9,379,524 B2
(45) Date of Patent: Jun. 28, 2016

(54) SEMICONDUCTOR DEVICE

(71) Applicant: Renesas Electronics Corporation, Kawasaki-shi, Kanagawa (JP)

(72) Inventors: Ryuji Kobayashi, Kanagawa (JP); Masahide Kobayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/680,678

(22) Filed: Apr. 7, 2015

(65) Prior Publication Data

US 2015/0311677 A1 Oct. 29, 2015

(30) Foreign Application Priority Data

Apr. 28, 2014 (JP) .................................. 2014-093020

(51) Int. Cl.
| | |
|---|---|
| *H01S 5/343* | (2006.01) |
| *H01S 5/22* | (2006.01) |
| *H01S 5/32* | (2006.01) |
| *H01S 5/34* | (2006.01) |

(52) U.S. Cl.
CPC ............ *H01S 5/34333* (2013.01); *H01S 5/221* (2013.01); *H01S 5/2216* (2013.01); *H01S 5/321* (2013.01); *H01S 5/3407* (2013.01)

(58) Field of Classification Search
CPC ....... H01S 5/00; H01S 5/02256; H01S 5/026; H01S 5/0614; H01S 5/20; H01S 5/2009; H01S 5/22

USPC ........ 372/43.01, 44.01, 45.01, 45.011, 46.01, 372/46.011

See application file for complete search history.

(56) References Cited

U.S. PATENT DOCUMENTS

| | | | |
|---|---|---|---|
| 7,606,278 B2 | 10/2009 | Kuramoto | |
| 2010/0025657 A1* | 2/2010 | Nagahama | B82Y 20/00 257/13 |
| 2013/0240901 A1* | 9/2013 | Kohda | H01L 29/2003 257/76 |
| 2014/0225161 A1* | 8/2014 | Okita | H01L 29/66431 257/192 |

FOREIGN PATENT DOCUMENTS

JP 2007-300016 A 11/2007

* cited by examiner

*Primary Examiner* — Dung Nguyen
(74) *Attorney, Agent, or Firm* — Sughrue Mion, PLLC

(57) ABSTRACT

The characteristics of a semiconductor laser are improved. In a semiconductor laser having an n type cladding layer, an active layer, and a p type cladding layer, a current block layer is provided. For example, the current block layer is arranged partially between the p type cladding layer and the active layer, and in the overlapping region of the p type cladding layer and the active layer. Thus, in a current narrowing region of the overlapping region of the p type cladding layer and the active layer, the current block layer is arranged, thereby to suppress the current injected into a part of the active layer. This results in the formation of a saturable absorbing region, which causes a difference in intensity of the optical output of the semiconductor laser. This can implement self-pulsation.

21 Claims, 13 Drawing Sheets

SEMICONDUCTOR DEVICE

CROSS-REFERENCE TO RELATED APPLICATIONS

The disclosure of Japanese Patent Application No. 2014-093020 filed on Apr. 28, 2014 including the specification, drawings and abstract is incorporated herein by reference in its entirety.

BACKGROUND

The present invention relates to a semiconductor device, and is preferably applicable to, for example, a semiconductor laser using a nitride semiconductor.

The development of a semiconductor laser as a light emitting device or a light source for an electronic device has been pursued.

For example, Patent Document 1 (Japanese Unexamined Patent Application Publication No. 2007-300016) discloses a semiconductor laser using a nitride type III-V group compound semiconductor, capable of a self-pulsation operation.

CITED DOCUMENT

Patent Document

Patent Document 1

Japanese Unexamined Patent Application Publication No. 2007-300016

SUMMARY

The present inventors have been involved in research and development of a semiconductor laser using a nitride semiconductor, and have conducted a close study on the improvement of the performances thereof. It has been shown during the process that there is room for a further improvement in terms of the structure in order to improve the performances of a semiconductor laser using a nitride semiconductor.

Other objects and novel features will be apparent from the description of this specification and the accompanying drawings.

Summaries of the representative ones of the embodiments disclosed in the present application will be described in brief as follows.

A semiconductor device shown in one embodiment disclosed in the present application has a current block layer between an active layer and a cladding layer.

Further, a semiconductor device shown in one embodiment disclosed in the present application has a first current block layer partially in a first region, and has a second current block layer covering a second region on each opposite side of the first region between an active layer and a cladding layer.

With a semiconductor device shown in a representative embodiment shown below disclosed in the present application, it is possible to improve the characteristics of the semiconductor device.

DETAILED DESCRIPTION

Figure 1:
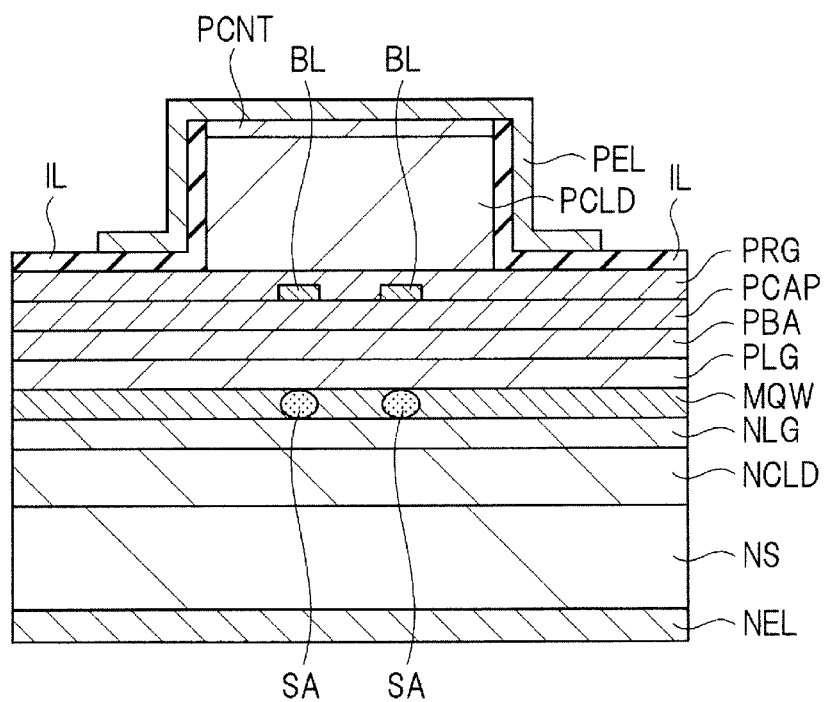
FIG. 1 is a cross sectional view showing a configuration of a semiconductor laser of First Embodiment.

In the following description of embodiments, the description may be divided into a plurality of sections, or embodiments for convenience, if required. However, unless otherwise specified, these are not independent of each other, but are in a relation such that one is a modification example, an applied example, a detailed description, a complementary explanation, or the like of a part or the whole of the other. Further, in the following embodiments, when a reference is made to the number of elements, and the like (including number, numerical value, quantity, range, or the like), the number of elements is not limited to a specific number, but may be greater than or less than the specific number, unless otherwise specified, except for the case where the number is apparently limited to the specific number in principle, and except for other cases.

Further, in the following embodiments, the constitutional elements (including element steps, or the like) are not always essential, unless otherwise specified, except for the case where they are apparently considered essential in principle, and except for other cases. Similarly, in the following embodiments, when a reference is made to the shapes, the positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numbers, and the like (including number, numerical value, quantity, range, and the like).

Below, embodiments will be described in details by reference to the accompanying drawings. Incidentally, in all the drawings for describing the embodiments, the members having the same function are given the same or related reference signs and numerals, and a repeated description thereon is omitted. Whereas, when a plurality of analogous members (sites) are present, a sign may be added to the generic reference signs and numerals to indicate an individual or specific site. Further, in the following embodiments, a description on the same or similar portions will not be repeated in principle, unless otherwise required.

Further, in the accompanying drawings for use in embodiments, hatching may be omitted even in cross section for ease of understanding of the drawing. Further, hatching may be added even to a plan view in order to ease of understanding of the drawing.

Further, in a cross sectional view and a plan view, the dimensions of each part are not intended to correspond to those of an actual device. For ease of understanding of the drawing, a specific part may be shown on a relatively larger scale. Whereas, also when a cross-sectional view and a plan view correspond to each other, for ease of understanding of the drawing, a specific part may be shown on a relatively larger scale.

First Embodiment

Below, a semiconductor laser (semiconductor device) of the present embodiment will be described in details with reference to the accompanying drawings. FIG. 1 is a cross sectional view showing a configuration of the semiconductor laser of the present embodiment.

[Structure Description]

As shown in FIG. 1, a semiconductor laser of the present embodiment uses an n type substrate NS as a substrate, and has a plurality of nitride semiconductor layers sequentially stacked thereover. Specifically, over the n type substrate NS, an n type cladding layer NCLD, an n type optical guide layer NLG, an active layer MQW, a p type optical guide layer PLG, a p type barrier layer PBA, a p type cap layer PCAP, a p type regrowth layer PRG, a p type cladding layer PCLD, and a p type contact layer PCNT are arranged sequentially from the bottom. Thus, the semiconductor laser of the present embodiment has a structure in which the active layer MQW is sandwiched between the nitride semiconductors opposite in conductivity type to each other and arranged at the overlaying layer and the underlying layer.

Then, over the p type contact layer PCNT at the uppermost layer, there is arranged a p side electrode PEL. Over the back surface of the n type substrate NS, there is arranged an n side electrode NEL.

Whereas, the lamination part of the p type cladding layer PCLD and the p type contact layer PCNT is processed in a line form. Such a structure in which the lamination part (the p type cladding layer PCLD and the p type contact layer PCNT) is arranged in a line form may be referred to as a ridge stripe structure. Below, the lamination part of the p type cladding layer PCLD and the p type contact layer PCNT may be referred to as a ridge stripe part. The ridge stripe part is arranged over the active layer MQW, and in apart of the formation region of the active layer MQW. Then, the sidewall of the ridge stripe part is covered with an insulation layer (insulation film) IL. The insulation layer IL is arranged from the sidewall of the ridge stripe part to over the portions of the p type regrowth layer PRG on the opposite sides thereof. Whereas, the p side electrode PEL is arranged over the p type contact layer PCNT and the insulation layer IL.

Herein, in the semiconductor laser of the present embodiment, over the p type cap layer PCAP, there is arranged the current block layer (current block film, current block region) BL. Thus, in the current narrowing region which is the overlapping region of the p type cladding layer PCLD and the active layer MQW, there is arranged the current block layer BL. As a result, a saturable absorbing region SA is formed, thereby to cause a difference in intensity of the optical output from the semiconductor laser. This enables the optical output to cause self-pulsation.

Below, the operation of the semiconductor laser will be briefly described.

First, the p side electrode PEL is applied with a positive voltage, and the n side electrode NEL is applied with a negative voltage. As a result, a forward current flows from the p side electrode PEL toward the n side electrode NEL. Thus, holes are injected into the active layer MQW from the p side electrode PEL through the ridge stripe part (the lamination part of the p type cladding layer PCLD and the p type contact layer PCNT), the p type regrowth layer PRG, the p type cap layer PCAP, the p type barrier layer PBA, and the p type optical guide layer PLG. On the other hand, electrons are injected from the n side electrode NEL into the n type substrate NS. The injected electrons are injected into the active layer MQW via the n type cladding layer NCLD and the n type optical guide layer NLG.

In the active layer MQW, the injected holes and electrons form population inversion. Thus, electrons transfer from the conduction band to the valence band by induced emission, thereby to generate light with a uniform phase. Then, the light generated in the active layer MQW is confined in the active layer MQW by the surrounding semiconductor layers (the p type cladding layer PCLD and the n type cladding layer NCLD) lower in refractive index than the active layer MQW. Further, the light confined in the active layer MQW reciprocates in a resonator including a cleavage plane (laser end face) formed in the semiconductor laser, thereby to be amplified by further induced emission. Then, the laser light oscillates in the active layer MQW, so that a laser light is emitted. At this step, the ridge stripe part is formed. As a result, a laser light is emitted from the region of the active layer MQW (the overlapping region of the p type cladding layer PCLD and the active layer MQW) situated under the ridge stripe part.

Herein, in the present embodiment, as described previously, the current block layer BL is arranged in the overlapping region of the p type cladding layer PCLD and the active layer MQW. This inhibits the current flowing from the p side electrode PEL through the ridge stripe part to the active layer MQW. Of the active layer MQW, the current-inhibited region (the region into which the current cannot flow) serves as the saturable absorbing region SA, so that the intensity of a laser light self-pulsates.

Namely, the saturable absorbing region SA periodically repeats absorption and transmission, so that the intensity of the laser light automatically varies with a frequency within the range of, for example, several hundred MHz to several GHz. For this reason, even in a dc-driven state, it is possible to obtain the same effects as with high frequency current superimposition. Specifically, multimode oscillation becomes possible. Further, it is possible to reduce the coherence. For example, in order to suppress uneven light emission due to speckle pattern characteristic of laser light, desirably, the semiconductor laser is caused to self-pulsate, thereby to reduce the coherence of the laser light.

The basis of such self-pulsation resides in that the refractive index and the carrier density oscillate temporally. In other words, the oscillation carrier density of the active layer differs between at the time of absorption and at the time of transmission of the saturable absorbing region. Accordingly, the refractive index also differs according to the plasma effect. Then, (1) the effect of the temporal oscillation of the refractive index results in an increase in individual axial modes (causes wavelength chirp), and further, (2) the temporal oscillation of the carrier density causes oscillation in gain spectrum, so that the spectrum width in time average also increases. These effects of (1) and (2) reduce the coherence.

Particularly, in order to implement self-pulsation with stability, it is necessary to shorten the carrier life in the saturable absorbing region. For example, in the Patent Document 1, dry etching damages the saturable absorbing layer, thereby to shorten the carrier life. However, the degree of damage by dry etching is difficult to control.

In contrast, in the present embodiment, it is possible to arrange the current block layer BL with good controllability. For this reason, it is possible to implement self-pulsation with stability. Further, only by adjusting the formation area and shape of the current block layer BL, it is possible to control the carrier density with ease.

Below, the configuration of the semiconductor laser of the present embodiment will be described in details.

As the n type substrate NS, there is used, for example, a substrate (n type GaN substrate) formed of gallium nitride (GaN) doped with an n type impurity.

As the n type cladding layer NCLD, there is used, for example, an aluminum gallium nitride layer (n type AlGaN layer) doped with an n type impurity. The thickness of the n type AlGaN layer is, for example, about 3 μm. The composition ratio of Al is, for example, about 0.02.

As the n type optical guide layer NLG, there is used a gallium nitride layer (n type GaN layer) doped with an n type impurity. The thickness of the n type GaN layer is, for example, about 0.2 μm.

As the n type impurity for the n type substrate NS, the n type cladding layer NCLD, and the n type optical guide layer NLG, there is used, for example, silicon (Si).

The active layer MQW is formed of, for example, a lamination in which well layers each formed of an indium gallium nitride layer (InGaN layer), and barrier layers each formed of an indium gallium nitride layer (InGaN layer) are alternately stacked. The structure of such a lamination is referred to as a multiple quantum well structure. Then, the indium composition of the indium gallium nitride layer (InGaN well layer) forming the quantum well layer and the indium composition of the indium gallium nitride layer (InGaN barrier layer) forming the barrier layer are different from each other. The indium composition ratios and the layer thicknesses of the layers are adjusted according to the desired oscillation wavelength. The oscillation wavelength is adjusted at, for example, about 400 nm to 410 nm.

As the p type optical guide layer PLG, there is used a gallium nitride layer (p type GaN layer) doped with a p type impurity. The thickness of the p type GaN layer is, for example, about 0.14 μm.

As the p type barrier layer PBA, there is used, for example, an aluminum gallium nitride layer (p type AlGaN layer) doped with a p type impurity. The thickness of the p type AlGaN layer is, for example, about 10 nm. The composition ratio of Al is, for example, about 0.24. The composition ratio of Al of the p type barrier layer PBA is larger than the composition ratio of Al of a p type cladding layer PCLD described later. The p type barrier layer PBA is larger in band gap than the p type cladding layer PCLD.

As the p type cap layer PCAP, there is used a gallium nitride layer (p type GaN layer) doped with a p type impurity. The thickness of the p type cap layer is, for example, about 10 nm.

As the p type regrowth layer PRG, there is used a gallium nitride layer (p type GaN layer) doped with a p type impurity. The thickness of the p type regrowth layer is, for example, about 20 nm.

As the p type cladding layer PCLD, there is used, for example, an aluminum gallium nitride layer (p type AlGaN layer) doped with a p type impurity. The thickness of the p type AlGaN layer is, for example, about 0.4 μm. The composition ratio of Al is, for example, about 0.04. Alternatively, the p type cladding layer PCLD is formed of a superlattice of a GaN layer and an AlGaN layer doped with a p type impurity. In this case, the thickness of the p type GaN layer is, for example, 2.5 nm, and the thickness of the p type AlGaN layer is, for example, 2.5 nm; the periodicity is 80 (the total thickness is 0.4 μm); and the Al composition ratio is, for example, about 0.08 (the average Al composition is 0.04).

As the p type contact layer PCNT, there is used a gallium nitride layer (p type GaN layer) doped with a p type impurity. The thickness of the p type GaN layer is, for example, about 0.1 μm.

As the p type impurity for the p type optical guide layer PLG, the p type barrier layer PBA, the p type cap layer PCAP, the p type regrowth layer PRG, the p type cladding layer PCLD, and the p type contact layer PCNT, there is used, for example, magnesium (Mg).

As the current block layer BL, there is used an aluminum nitride layer (AlN layer). The thickness of the AlN layer is, for example, about 10 nm.

Herein, the active layer MQW is smaller in band gap than the n type cladding layer NCLD. Further, the active layer MQW is smaller in band gap than the p type cladding layer PCLD. More specifically, herein, over the active layer MQW, there is provided a lamination part of the p type nitride semiconductors. The active layer MQW is smaller in band gap than respective layers forming the lamination part of the p type nitride semiconductors. Further, under the active layer MQW, there is provided a lamination part of an n type nitride semiconductors. The active layer MQW is smaller in band gap than respective layers forming the lamination part of the n type nitride semiconductors. Furthermore, the lamination part of the n type nitride semiconductors and the lamination part of the p type nitride semiconductors are lower in refractive index than the active layer MQW.

Then, the current block layer BL is formed of a nitride semiconductor, and is larger in band gap than all of the active layer MQW, the n type cladding layer NCLD, and the p type cladding layer PCLD. More specifically, the current block layer BL is larger in band gap than any layer of the active layer MQW, the lamination part of the p type nitride semiconductors thereover, and the lamination part of the n type nitride semiconductors thereunder.

The width of the ridge stripe part (the lamination part of the p type cladding layer PCLD and the p type contact layer PCNT) is, for example, about 1.4 μm.

Whereas, as the insulation layer IL arranged over the sidewall of the ridge stripe part, and the portions of the p type regrowth layer PRG on the opposite sides of the ridge stripe part, there is used, for example, a silicon oxide film.

As the p side electrode PEL, there is used, for example, a lamination film of platinum (Pt) and gold (Au). Whereas, as the n side electrode NEL, there is used, for example, a lamination film of titanium (Ti), platinum (Pt), and gold (Au).

Incidentally, the constituent materials (including the composition), the thickness, and the like of the nitride semiconductor layers, the insulation layers, and the electrodes can be appropriately changed in consideration of the desired characteristics and the like of the semiconductor laser element.

Thus, with the semiconductor laser of the present embodiment, the provision of the current block layer BL inhibits the current to be injected into a part of the active layer MQW. For this reason, the portions become the saturable absorbing region SA, which can implement self-pulsation (see FIG. 1).

[Manufacturing Method Description]

Then, with reference to FIGS. 2 to 12, a method for manufacturing the semiconductor laser of the present embodiment will be described, and the configuration of the semiconductor laser will be made clearer. FIGS. 2 to 12 are each a cross sectional view or a plan view showing the semiconductor laser of the present embodiment during a manufacturing step.

Figure 2:
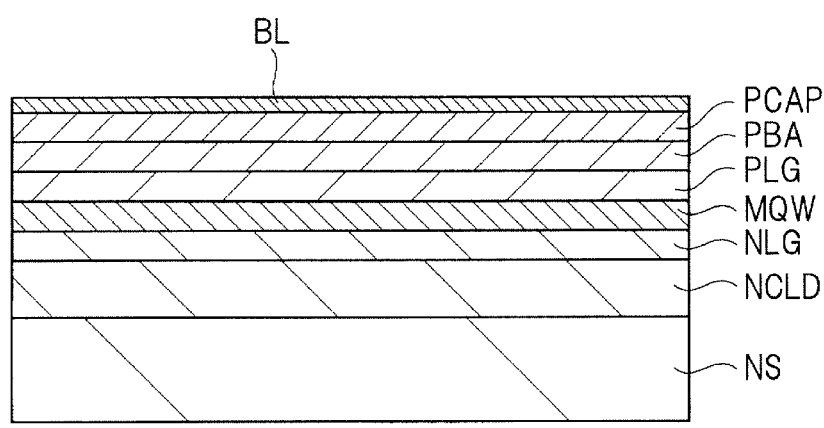
FIG. 2 is a cross sectional view showing the semiconductor laser of First Embodiment during a manufacturing step.

As shown in FIG. 2, as the n type substrate NS, there is provided, for example, a substrate formed of gallium nitride (GaN) doped with an n type impurity. Thereover, an n type AlGaN layer as the n type cladding layer NCLD, and an n type GaN layer as the n type optical guide layer NLG are sequentially deposited. While introducing a carrier gas and a raw material gas into the device using, for example, a 300-hPa decompression MOVPE (Metal Organic Vapor Phase Epitaxy, organic metal vapor deposition) device, respective layers are sequentially grown. For the carrier gas, there is used hydrogen, or nitrogen, or a mixed gas of hydrogen and nitrogen. For the raw material gas, there is used a gas including the constituent element of the nitride semiconductor. For example, for deposition of the n type cladding layer NCLD (n type AlGaN layer), as Al, Ga, and N raw materials, there are used TMAl (trimethylaluminum), TMGa (trimethylgallium), and $NH_3$ (ammonia), respectively. As the raw material for the n type impurity, there is used $SiH_4$ (silane). The n type substrate NS is set in the device. Thus, while supplying $NH_3$, the substrate is raised in temperature. After the temperature reaches the growth temperature, the n type cladding layer NCLD (n type AlGaN layer) is crystallinically grown while introducing the raw material gas with the carrier gas into the device. The growth temperature is, for example, about 1100° C.

Subsequently, the raw material gas is switched, and the n type optical guide layer NLG (n type GaN layer) is crystallinically grown. For deposition of the n type optical guide layer NLG (n type GaN layer), TMGa (trimethylgallium) and $NH_3$ (ammonia) are used as Ga and N raw materials, respectively. As the raw material for the n type impurity, there is used $SiH_4$ (silane). The growth temperature is, for example, about 1100° C.

Subsequently, the raw material gas is switched. Thus, the active layer MQW (the multiple quantum well structure in which InGaN well layers and InGaN barrier layers different in indium composition are alternately stacked) is crystallinically grown. For deposition of the active layer MQW (the InGaN well layers and the InGaN barrier layers), TMIn (trimethylindium), TMGa (trimethylgallium), and $NH_3$ (ammonia) are used as In, Ga, and N raw materials, respectively. By switching the flow rate of TMIn (trimethylindium) of the In raw material, it is possible to alternately stack the InGaN well layers and the InGaN barrier layers different in indium composition. The growth temperature is, for example, about 800° C.

Subsequently, the raw material gas is switched, and the p type optical guide layer PLG (p type GaN layer) is crystallinically grown. For deposition of the p type optical guide layer PLG (p type GaN layer), TMGa (trimethylgallium) and $NH_3$ (ammonia) are used as Ga and N raw materials, respectively. As the raw material for the p type impurity, there is used $Cp_2Mg$ (bis(cyclopentadienyl)magnesium, $(C_5H_5)_2Mg$)). The growth temperature is, for example, about 1100° C.

Subsequently, the raw material gas is switched, and the p type barrier layer PBA (p type AlGaN layer) is crystallinically grown. For deposition of the p type barrier layer PBA (p type AlGaN layer), TMAl (trimethylaluminum), TMGa (trimethylgallium), and $NH_3$ (ammonia) are used as Al, Ga, and N raw materials, respectively. As the raw material for the p type impurity, there is used $Cp_2Mg$ (bis(cyclopentadienyl)magnesium). The growth temperature is, for example, about 1100° C.

Subsequently, the raw material gas is switched, and the p type cap layer PCAP (p type GaN layer) is crystallinically grown. For deposition of the p type cap layer PCAP (p type GaN layer), TMGa (trimethylgallium) and $NH_3$ (ammonia) are used as Ga and N raw materials, respectively. As the raw material for the p type impurity, there is used $Cp_2Mg$ (bis(cyclopentadienyl)magnesium). The growth temperature is, for example, about 1100° C.

Subsequently, the raw material gas is switched, and the current block layer BL (AlN layer) is crystallinically grown. For deposition of the current block layer BL (AlN layer), TMAl (trimethylaluminum) and $NH_3$ (ammonia) are used as Al and N raw materials, respectively. The growth temperature is, for example, about 400° C. Thus, by performing deposition at a relatively lower temperature (e.g., at a lower temperature than that of the active layer MQW), it is possible to form the current block layer BL (AlN layer) in an amorphous state.

Figure 3:
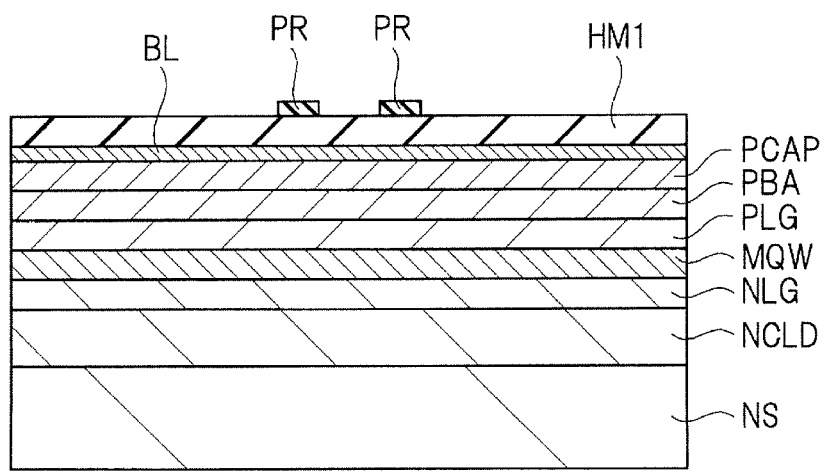
FIG. 3 is a cross sectional view showing the semiconductor laser of First Embodiment during a manufacturing step following FIG. 2.
Figure 4:
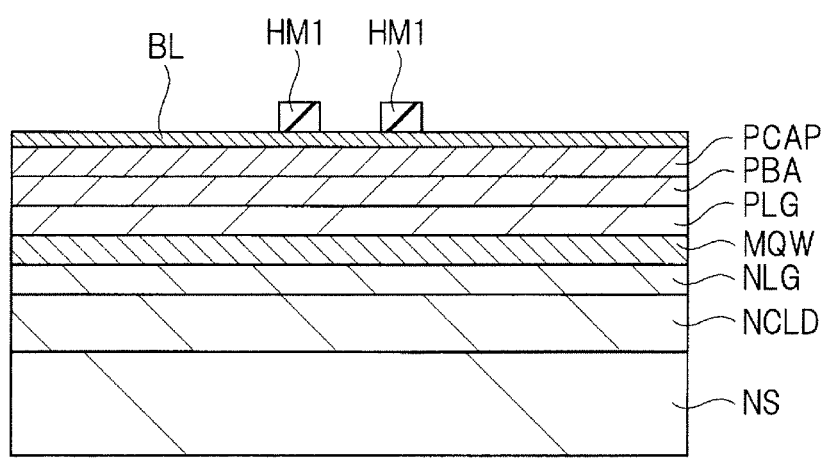
FIG. 4 is a cross sectional view showing the semiconductor laser of First Embodiment during a manufacturing step following FIG. 3.
Figure 5:
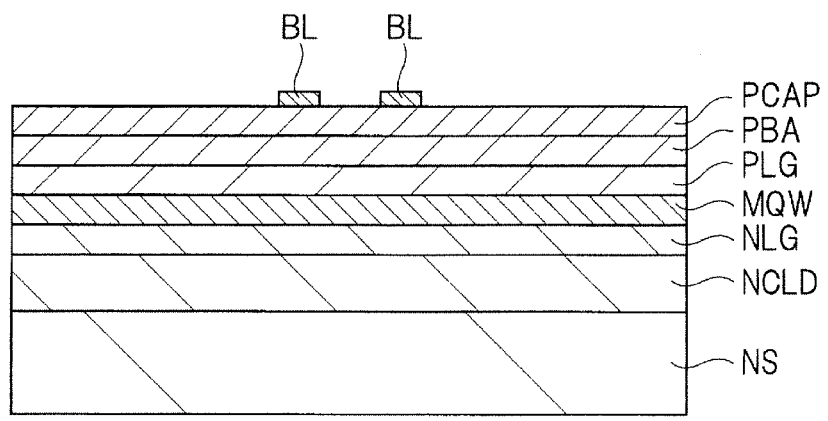
FIG. 5 is a cross sectional view showing the semiconductor laser of First Embodiment during a manufacturing step following FIG. 4.

Then, as shown in FIGS. 3 to 5, the current block layer BL (AlN layer) is patterned. For example, over the current block layer BL (AlN layer), there is formed a hard mask HM1. Using, for example, a CVD (Chemical Vapor Deposition) method, over the current block layer BL (AlN layer), a silicon oxide film is formed with a film thickness of about 0.1 μm. Then, over the hard mask HM1 (silicon oxide film), a photoresist film PR is applied. Then, using a photolithography technology, the photoresist film PR is left only in the regions in which the current block layer BL (AlN layer) is left (FIG. 3). Then, with the photoresist film PR as a mask, the hard mask HM1 (silicon oxide film) is etched. As the etching method, there may be used any of a dry etching method and a wet etching method. Then, the photoresist film PR is removed by ashing or the like (FIG. 4). Then, with the hard mask HM1 (silicon oxide film) as a mask, the current block layer BL (AlN layer) is etched and removed (FIG. 5). As the etching method, there may be used any of a dry etching method and a wet etching method. As described previously, the current block layer BL (AlN layer) is deposited at a relatively lower temperature (e.g., at a lower temperature than that of the active layer MQW), thereby to form the current block layer BL (AlN layer) in an amorphous state. As a result, even when the wet etching method is used, etching can be performed with ease. Incidentally, the current block layer BL (AlN layer) in an amorphous state is crystallized by a heat load of the subsequent treatments. Further, the p type cap layer PCAP (p type GaN layer) is previously formed at the underlying layer of the current block layer BL. For this reason, for patterning of the current block layer BL (AlN layer), the p type cap layer PCAP serves as an etching stopper. This can prevent the etching damage, oxidation due to exposure, and the like of the underlying layer. Herein, it is possible to prevent the etching damage on the p type barrier layer PBA (p type AlGaN layer), which can prevent oxidation thereof.

Figure 6:
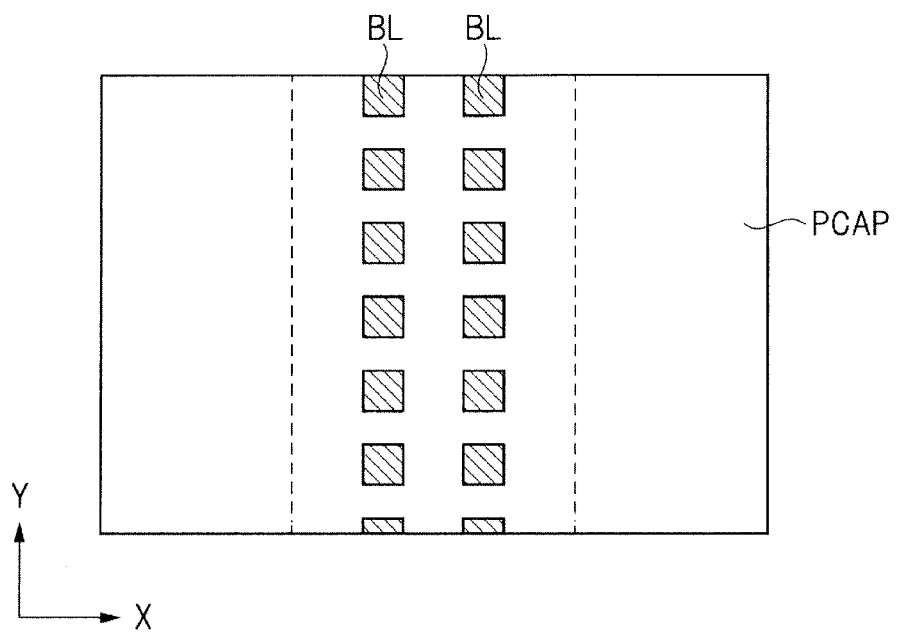
FIG. 6 is a plan view showing the semiconductor laser of First Embodiment during a manufacturing step.

The plan configuration of the current block layer BL as seen from the top surface thereof is, for example, a generally rectangular shape (tetragonal shape) (FIG. 6). Further, the current block layer BL is arranged in the formation region of the ridge stripe part (the lamination part of the p type cladding layer PCLD and the p type contact layer PCNT) (the region in a line shape (a rectangular shape having a long side in the Y direction), the region of a broken line of FIG. 6). Herein, as shown in FIG. 6, the lines of the current block layers BL arranged at a given interval in the Y direction are arranged in two columns. From between the current block layers BL, there is exposed the p type cap layer PCAP (p type GaN layer).

Figure 7:
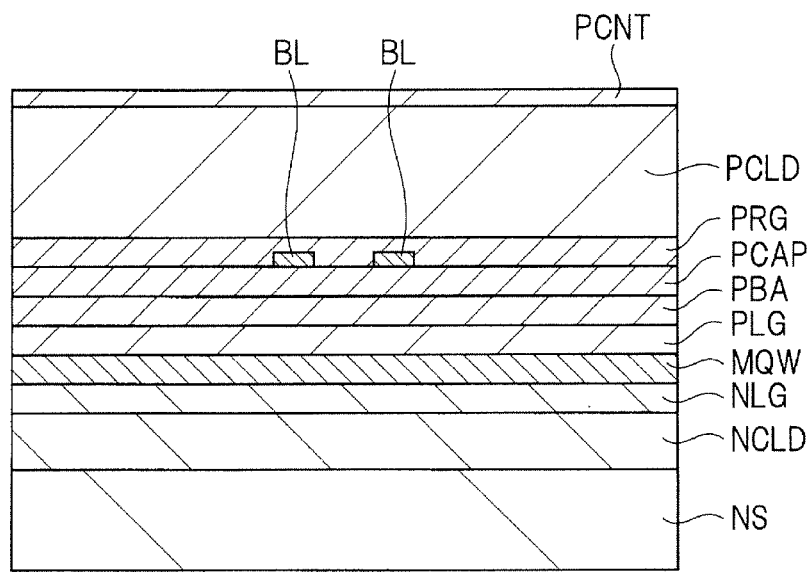
FIG. 7 is a cross sectional view showing the semiconductor laser of First Embodiment during a manufacturing step following FIG. 5.

Then, as shown in FIG. 7, over the current block layers BL (AlN layers) and the p type cap layer PCAP (p type GaN layer), a p type GaN layer is deposited as the p type regrowth layer PRG. Using, for example, a 300-hPa decompression MOVPE device, deposition is performed while introducing the carrier gas and the raw material gas into the device. For example, TMGa (trimethylgallium) and $NH_3$ (ammonia) are used as Ga and N raw materials, respectively. As the raw material for the p type impurity, there is used $Cp_2Mg$ (bis(cyclopentadienyl)magnesium). The growth temperature is, for example, about 1100° C.

Subsequently, the raw material gas is switched, and the p type cladding layer PCLD (p type AlGaN) are crystallinically grown. For deposition of the p type cladding layer PCLD (p type AlGaN), TMAl (trimethylaluminum), TMGa (trimethylgallium), and $NH_3$ (ammonia) are used as Al, Ga, and N raw materials, respectively. As the raw material for the p type impurity, there is used $Cp_2Mg$ (bis(cyclopentadienyl)magnesium). The growth temperature is, for example, about 1100° C. After previously forming the p type regrowth layer PRG (p type GaN layer) at the underlying layer, a p type cladding layer PCLD (p type AlGaN) is crystallinically grown. As a result, the crystallinity of the p type cladding layer PCLD (p type AlGaN) is improved than when the p type cladding layer PCLD (p type AlGaN) is crystallinically grown directly over the region in which two kinds of layers (the current block layer BL (AlN layer) and the p type cap layer PCAP (p type GaN layer)) are mixed. Particularly, when over an Al-containing nitride semiconductor layer, another Al-containing nitride semiconductor layer is crystallinically grown, the crystallinity may be reduced. For this reason, by crystallinically growing the p type cladding layer PCLD (p type AlGaN) after forming the p type regrowth layer PRG (p type GaN layer), it is possible to improve the crystallinity of the p type cladding layer PCLD (p type AlGaN).

Subsequently, the raw material gas is switched, and the p type contact layer PCNT (p type GaN layer) is crystallinically grown. For deposition of the p type contact layer PCNT (p type GaN layer), TMGa (trimethylgallium) and $NH_3$ (ammonia) are used as Ga and N raw materials, respectively. As the raw material for the p type impurity, there is used $Cp_2Mg$ (bis(cyclopentadienyl)magnesium). The growth temperature is, for example, about 1100° C.

Figure 8:
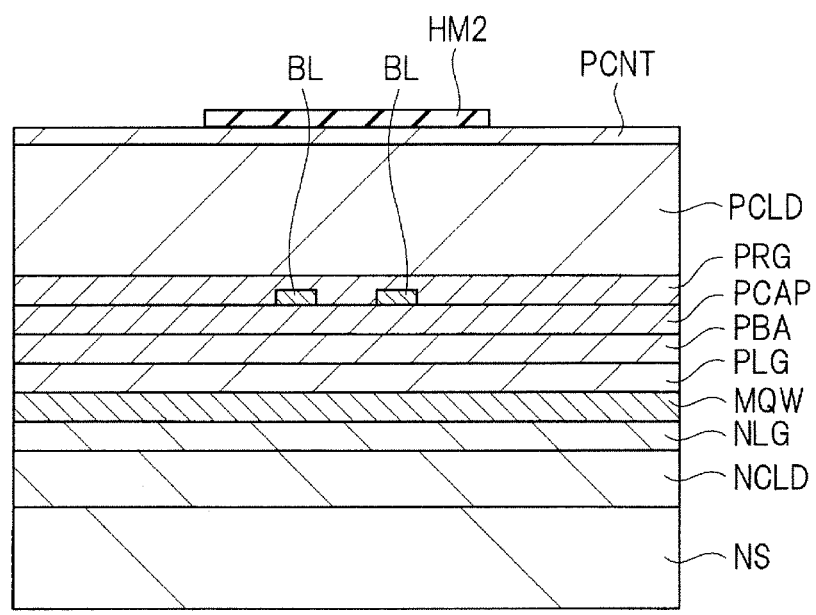
FIG. 8 is a cross sectional view showing the semiconductor laser of First Embodiment during a manufacturing step following FIG. 7.
Figure 9:
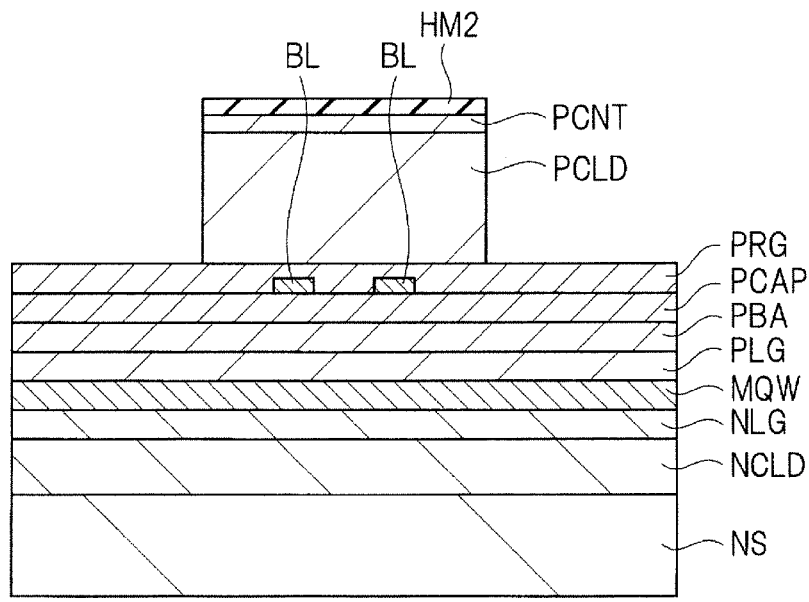
FIG. 9 is a cross sectional view showing the semiconductor laser of First Embodiment during a manufacturing step following FIG. 8.

Then, as shown in FIGS. 8 and 9, the p type cladding layer PCLD (p type AlGaN) and the p type contact layer PCNT (p type GaN layer) are patterned, thereby to form the ridge stripe part. For example, over the p type contact layer PCNT (p type GaN layer), there is formed a hard mask HM2. Using, for example, a CVD method, over the p type contact layer PCNT (p type GaN layer), a silicon oxide film is formed with a film thickness of about 0.1 µm. Then, over the hard mask HM2 (silicon oxide film), a photoresist film not shown is applied. Then, using a photolithography technology, the photoresist film is left in the formation region of the ridge stripe part (see the broken line of FIG. 6). Then, with the photoresist film as a mask, the hard mask HM2 (silicon oxide film) is etched. As the etching method, there may be used any of a dry etching method and a wet etching method. Then, the photoresist film is removed by asking or the like (FIG. 8). Then, with the hard mask HM2 (silicon oxide film) as a mask, the p type cladding layer PCLD (p type AlGaN) and the p type contact layer PCNT (p type GaN layer) are etched (FIG. 9). As the etching method, there may be used any of a dry etching method and a wet etching method. Then, the hard mask HM2 is removed. As a result, it is possible to form a ridge stripe part (the lamination part of the p type cladding layer PCLD and the p type contact layer PCNT) with a width of about 1.4 µm. The term "width" herein used represents, for example, the width in the X direction in FIG. 6. On the opposite sides of the ridge stripe part, there are exposed the portions of the p type regrowth layer PRG (p type GaN layer).

Figure 10:
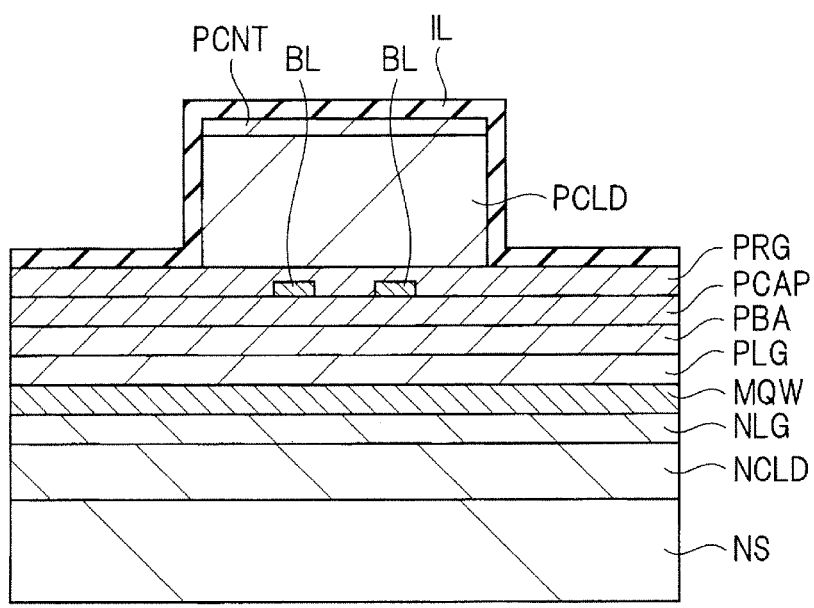
FIG. 10 is a cross sectional view showing the semiconductor laser of First Embodiment during a manufacturing step following FIG. 9.

Then, as shown in FIG. 10, over the ridge stripe part (the lamination part of the p type cladding layer PCLD and the p type contact layer PCNT) and the p type regrowth layer PRG (p type GaN layer), as the insulation layer IL, for example, a silicon oxide film is formed using a CVD method or the like. As a result, the top surface and the side surface of the ridge stripe part are covered with the insulation layer IL (silicon oxide film). Whereas, the portions of the p type regrowth layer PRG (p type GaN layer) on the opposite sides of the ridge stripe part are covered with the insulation layer IL (silicon oxide film).

Figure 11:
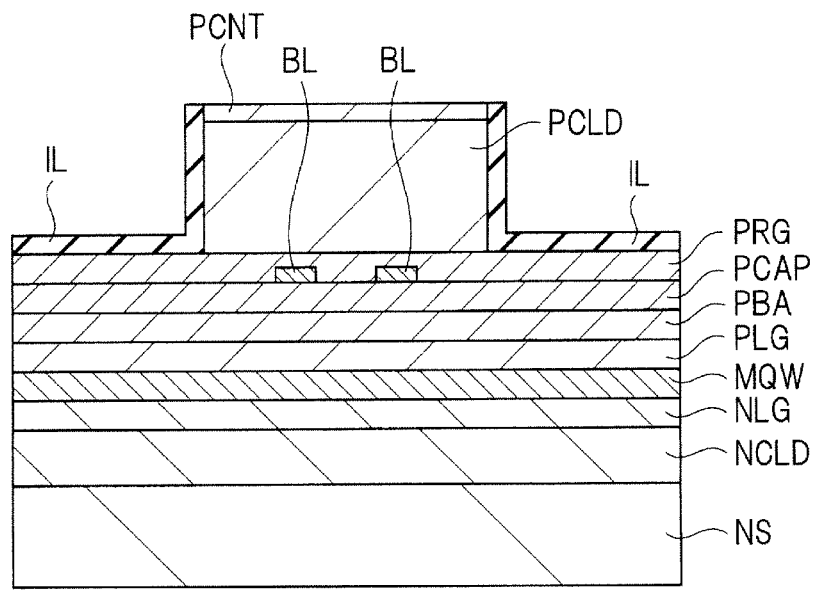
FIG. 11 is a cross sectional view showing the semiconductor laser of First Embodiment during a manufacturing step following FIG. 10.

Then, as shown in FIG. 11, there is removed the insulation layer IL at the top surface of the ridge stripe part (the lamination part of the p type cladding layer PCLD and the p type contact layer PCNT). For example, with a photoresist film (not shown) having an opening over the ridge stripe part as a mask, the insulation layer IL is etched. Then, the photoresist film is removed by ashing or the like.

Figure 12:
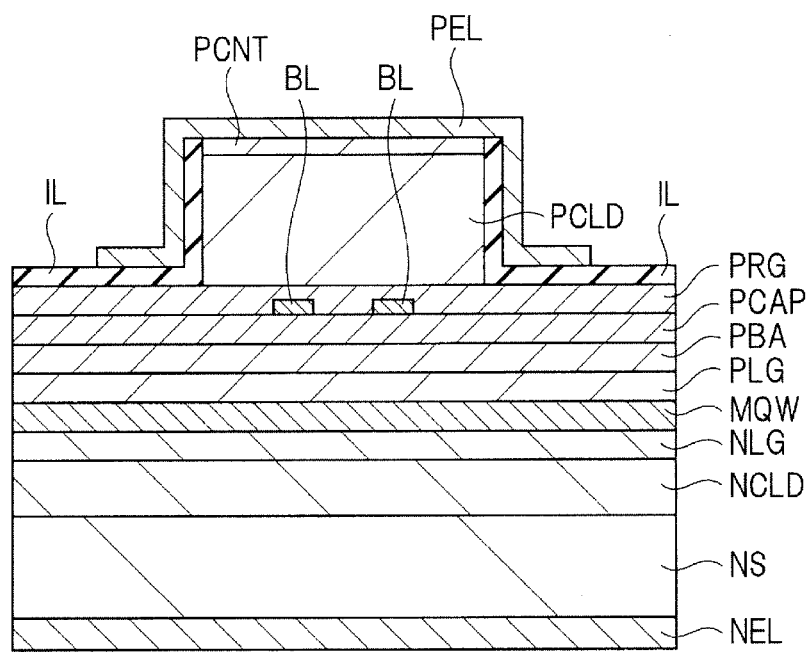
FIG. 12 is a cross sectional view showing the semiconductor laser of First Embodiment during a manufacturing step following FIG. 11.

Then, as shown in FIG. 12, over the ridge stripe part (the lamination part of the p type cladding layer PCLD and the p type contact layer PCNT) and the insulation layer IL, there is formed a p side electrode. For example, over the ridge stripe part and the insulation layer IL, for example, a palladium (Pd) film and a platinum (Pt) film are sequentially formed by a vapor deposition method or the like. Then, if required, the lamination film of the platinum (Pt) film and the gold (Au) film is patterned, and then is subjected to a heat treatment, thereby to reduce the contact resistance. As a result, the p side electrode PEL is formed.

Then, with the back surface side of the n type substrate NS as the top surface, the back surface of the n type substrate NS is polished, thereby to reduce the film thickness of the n type substrate NS. For example, the n type substrate NS is set with a thickness of about 100 μm. Then, at the back surface of the n type substrate NS, for example, a titanium (Ti) film, a platinum (Pt) film, and a gold (Au) film are sequentially formed by a vapor deposition method or the like. Then, a heat treatment is performed, thereby to reduce the contact resistance. As a result, an n side electrode NEL is formed (FIG. 12).

By the steps up to this point, it is possible to form the semiconductor laser of the present embodiment.

Thus, in accordance with the present embodiment, the current block layer BL prevents a current from being injected into a part of the active layer MQW. For this reason, it is possible to manufacture a self-pulsation type semiconductor laser in which the portion serves as a saturable absorbing region (see FIG. 1).

Specifically, (1) carriers are injected from the p side electrode PEL into the active layer MQW, resulting in generation of a gain. However, the current block layer BL inhibits carrier injection into the active layer MQW (saturable absorbing region SA) immediately thereunder, which serves as a loss region. In a state where loss>gain, laser oscillation is inhibited. (2) With an increase in injected carriers, the number of carriers injected into the saturable absorbing region SA also increases (the loss is reduced). This finally results in a state where loss<gain, so that laser oscillation is caused. (3) Upon generation of laser oscillation, the carrier consumption at the active layer MQW increases (the carrier life at the active layer MQW is shortened). As a result, the carrier density of the saturable absorbing region SA is reduced, resulting in an increase in loss. Thus, laser oscillation is stopped. (4) Upon stop of laser oscillation, the carrier density of the active layer MQW increases, resulting in the state of (2). Resultantly, a change of from (2) through (3) to (4) and returning to (2) and the subsequent states again is repeated. For example, the change is repeated at several hundred MHz to several GHz. As a result, it is possible to obtain the same operation (self-pulsation) as with superimposition of high frequency current in a dc-driven state.

The temperature and optical output which can provide the self-pulsation are determined by the balance between the amount of gain generated at the active layer MQW and the amount of loss of the saturable absorbing region SA. For example, when the current block layer BL is made larger to set the loss of the saturable absorbing region SA larger, the loss of the saturable absorbing region SA is eliminated. This results in self-pulsation at up to high optical output. However, in a high-temperature operation, the gain of the active layer MQW becomes smaller. Accordingly, the maximum temperature which can provide self-pulsation becomes lower. On the other hand, when the loss of the saturable absorbing region SA is small, the optical output which can provide self-pulsation is reduced. However, self-pulsation at high temperatures becomes easier.

The size of the saturable absorbing region SA can be arbitrarily controlled by intentionally changing the size of the current block layer BL. Accordingly, in accordance with the semiconductor laser of the present embodiment, by adjusting the size of the current block layer BL, it is possible to readily adjust the balance between the amount of gain generated at the active layer MQW and the amount of loss of the saturable absorbing region SA (i.e., optical output).

Figure 13A:
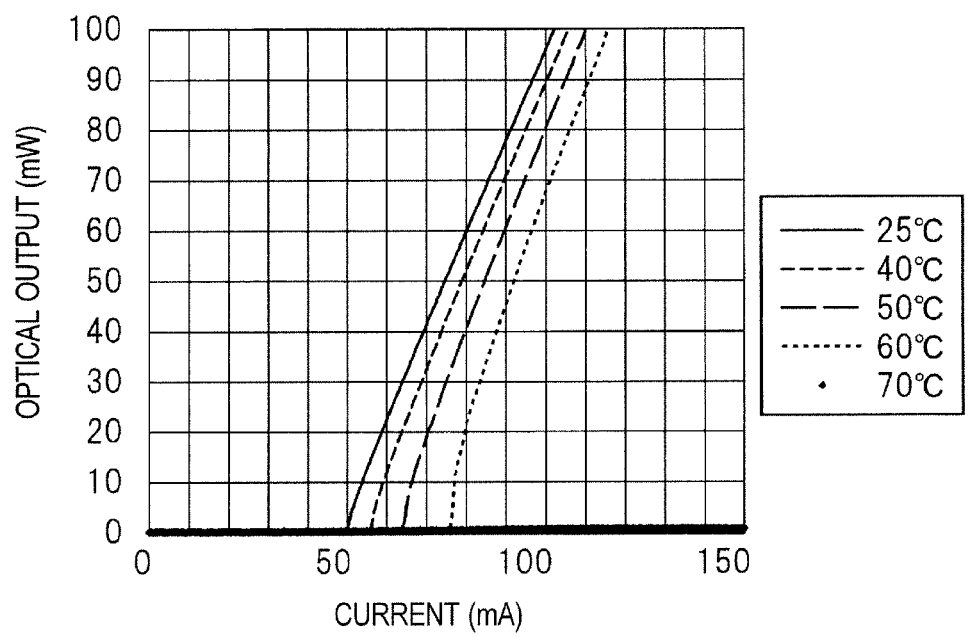
FIGS. 13A and 13B are each a graph showing the current-optical output characteristics of the semiconductor laser of First Embodiment.
Figure 13B:
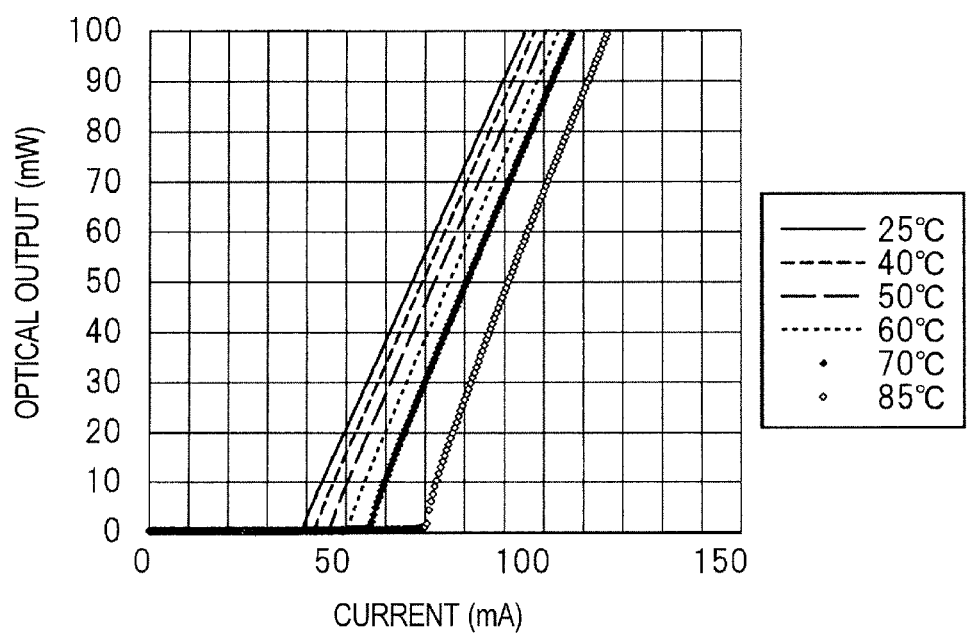

FIGS. 13A and 13B are each a graph showing the current-optical output characteristics of the semiconductor laser of the present embodiment. FIG. 13A shows the case where the saturable absorbing region SA is large (type A). FIG. 13B shows the case where the saturable absorbing region SA is small (type B). In respective graphs, the horizontal axis represents the current (mA), and the vertical axis represents the optical output (mW).

As shown in FIG. 13A, in the case of the type A, at from 25° C. to 60° C., multimode oscillation characteristic of self-pulsation can be observed. Further, at 60° C., self-pulsation can be observed at up to an output as high as 15 mW. On the other hand, as shown in FIG. 13B, in the case of the type B, at from 25° C. to a temperature as high as 85° C., self-pulsating operation can be observed. However, at 60° C., the optical output which can provide self-pulsation is 8 mW which is a lower optical output than that of the type A.

Incidentally, in the region in which the slope ($\Delta L/\Delta I$) of the current-optical output characteristics (I-L characteristics) is gentle, self-pulsating operation is performed with stability. For this reason, in the graphs shown in FIGS. 13A and 13B, the optical output in the range up to the inflection point of the slope of the current-optical output characteristics is regarded as an effective optical output.

The graphs shown in FIGS. 13A and 13B also indicate the relation between the size of the saturable absorbing region SA and the optical output. Thus, in accordance with the semiconductor laser of the present embodiment, the size of the saturable absorbing region SA can be readily controlled by the size of the current block layer BL. This facilitates the adjustment of optical output.

In contrast, as the technology described in, for example, the Patent Document 1, with the method in which a self-pulsating operation is caused by damages of dry etching, control thereof is difficult. Namely, it is difficult to gradually adjust the damages of dry etching. For this reason, it is difficult to control the self-pulsating operation. Further, the reproducibility of self-pulsating operation may be reduced. In contrast, in accordance with the semiconductor laser of the present embodiment, the size of the saturable absorbing region SA can be readily controlled by the size of the current block layer BL. For this reason, control of the self-pulsating operation is easy, and the self-pulsating operation can be controlled with good reproducibility.

Figure 14A:
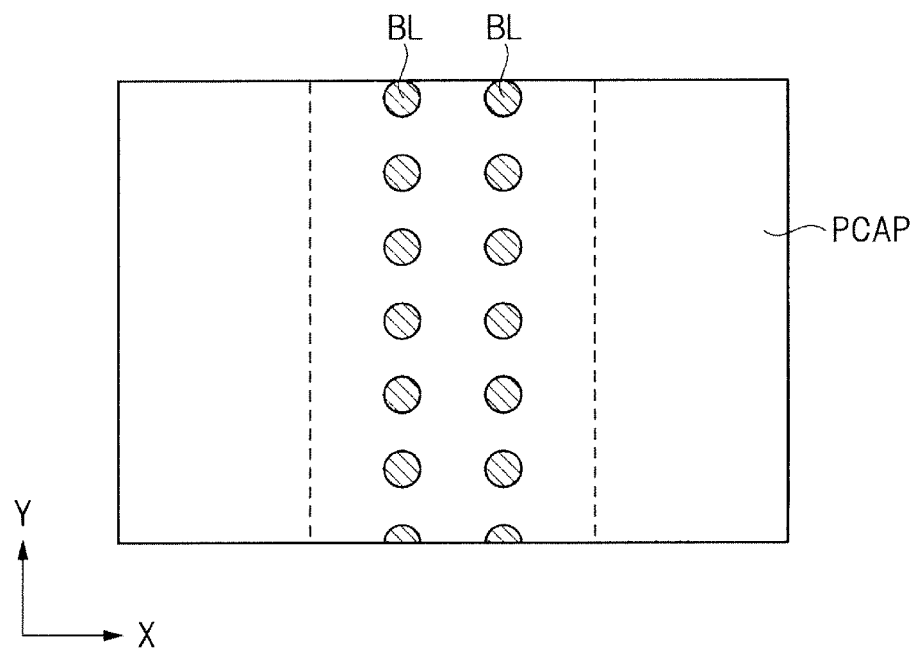
FIGS. 14A and 14B are each a plan view showing another example of the plan configuration of a current block layer.
Figure 14B:
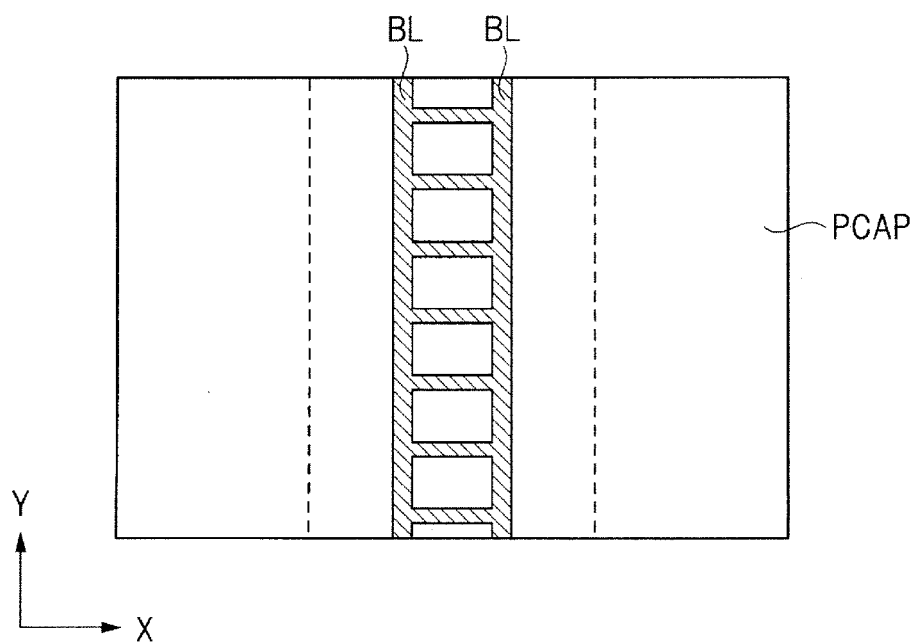

Incidentally, in the present embodiment, the plan configuration of the current block layer BL as seen from the top surface thereof is set to be a generally rectangular shape (FIG. 6). However, other shapes are also acceptable. FIGS. 14A and 14B are each a plan view showing another example of the plan configuration of the current block layer.

As shown in FIG. 14A, for example, the lines of the current block layers BL in which the current block layers BL in a generally circular shape are arranged at a given interval in the Y direction may be arranged in two columns.

Further, as shown in FIG. 14B, the plan configuration of the current block layer BL as seen from the top surface thereof may be formed in, for example, a ladder shape. In other words, the current block layer BL may be formed of two main line parts extending in the Y direction, and a plurality of branch line parts extending in the X direction in such a manner as to ensure a connection between the main line parts.

Thus, the current block layer BL is formed not in a single large plan configuration, but as an aggregation of a plurality of unit shapes, or in a shape having a plurality of openings. As a result, it is possible to improve the crystallinity of the layer (herein, the p type regrowth layer PRG) to be crystallinically grown at the overlying layer. Further, the formation area of the current block layer BL is preferably set at, for example, about 5% to 30% per that of the formation region of the ridge stripe part (the lamination part of the p type cladding layer PCLD and the p type contact layer PCNT) (the broken line of FIG. 6). Of these, about 20% to 30% results in the semiconductor laser of the type A, and about 5% to 15% results in the semiconductor laser of the type B.

Second Embodiment

Figure 15:
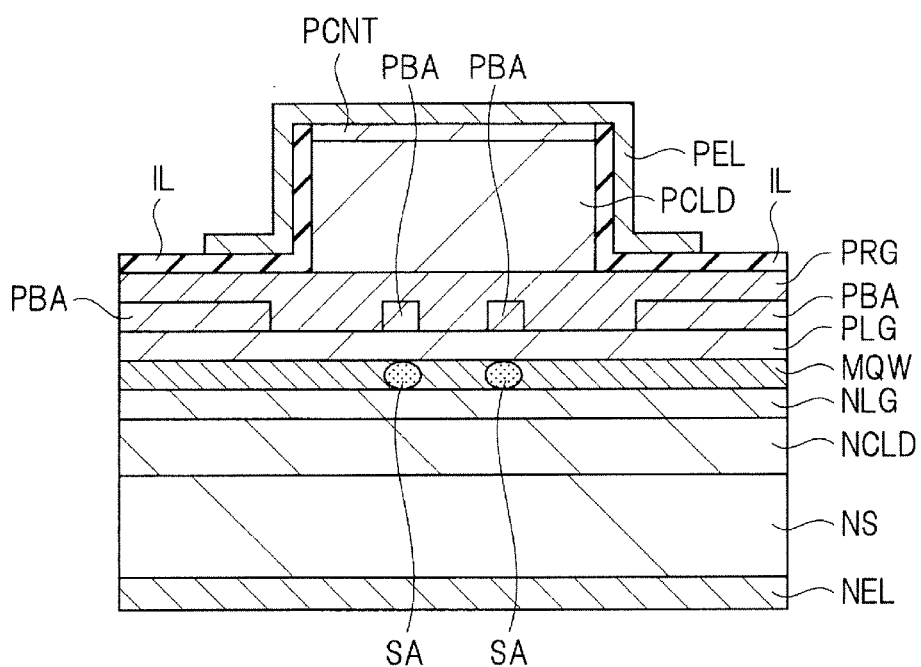
FIG. 15 is a cross sectional view showing a configuration of a semiconductor laser of Second Embodiment.

Below, with reference to the accompanying drawings, the semiconductor laser of the present embodiment (semiconductor device) will be described in details. FIG. 15 is a cross sectional view showing a configuration of the semiconductor laser of the present embodiment. Incidentally, the same parts as those of First Embodiment are given the same reference numerals and signs, and a detailed description thereon will be omitted.

[Structure Description]

As shown in FIG. 15, the semiconductor laser of the present embodiment uses an n type substrate NS as a substrate, and has a plurality of nitride semiconductor layers sequentially stacked thereover. Specifically, as with First Embodiment, over the n type substrate NS, an n type cladding layer NCLD, an n type optical guide layer NLG, and an active layer MQW are arranged sequentially from the bottom. As the constituent materials for the layers, there may be used the same materials as those of First Embodiment.

Then, over the active layer MQW, a p type optical guide layer PLG and a p type barrier layer PBA are arranged sequentially from the bottom. As the constituent materials for the layers, there may be used the same materials as those of First Embodiment.

Herein, in the semiconductor laser of the present embodiment, the p type barrier layer PBA is patterned. In other words, in the overlapping region of the p type cladding layer PCLD and the active layer MQW, the p type barrier layer PBA is partially arranged. Incidentally, on the opposite sides of the overlapping region of the p type cladding layer PCLD and the active layer MQW, the p type barrier layer PBA is left.

The plan configuration of the p type barrier layer PBA arranged in the overlapping region of the p type cladding layer PCLD and the active layer MQW as seen from the top surface thereof is, for example, a generally rectangular shape (the same as the current block layer BL of FIG. 6. See FIG. 6). In other words, the p type barrier layer PBA is arranged in the formation region of the ridge stripe part (the lamination part of the p type cladding layer PCLD and the p type contact layer PCNT) (the broken line of FIG. 6). For example, as shown in FIG. 6, the lines of the p type barrier layers PBA arranged at a given interval in the Y direction are arranged in two columns. From between the p type barrier layer PBA, there is exposed the p type optical guide layer PLG.

As described in details in First Embodiment, the p type barrier layer PBA is formed of a nitride semiconductor, and is larger in band gap than any of the active layer MQW, the n type cladding layer NCLD, and the p type cladding layer PCLD. More particularly, the p type barrier layer PBA is larger in band gap than the active layer MQW, the lamination part of the p type nitride semiconductors thereover, and the lamination part of the n type nitride semiconductors thereunder.

Further, over the p type optical guide layer PLG and the p type barrier layer PBA, as with First Embodiment, there is arranged a p type regrowth layer PRG. Then, over the p type regrowth layer PRG, as in the case of First Embodiment, there is arranged a ridge stripe part formed of the p type contact layer PCNT and the p type cladding layer PCLD. As the constituent materials for the layers, there may be used the same materials as those of First Embodiment.

The sidewall of the ridge stripe part is covered with an insulation layer (insulation film) IL. The insulation layer IL is arranged from the sidewall of the ridge stripe part to over the portions of the p type regrowth layer PRG on the opposite side thereof.

Then, over the p type contact layer PCNT at the uppermost layer, there is arranged a p side electrode PEL. At the back surface of the n type substrate NS, there is arranged an n side electrode NEL.

Herein, also in the present embodiment, as in the case of First Embodiment, in the overlapping region of the p type cladding layer PCLD and the active layer MQW, the p type barrier layer PBA is partially arranged. This inhibits the current flowing from the p side electrode PEL through the ridge stripe part to the active layer MQW. Of the active layer MQW, the current-inhibited region (the region into which the current cannot flow) serves as the saturable absorbing region SA, so that the intensity of a laser light self-pulsates. Accordingly, the same effects as those of First Embodiment are exerted.

Further, as with First Embodiment, without separately providing the current block layer BL, the p type barrier layer PBA which is a layer having a large band gap is used to form the saturable absorbing region SA. For this reason, a self-pulsation type semiconductor laser can be implemented with a simpler configuration than that of First Embodiment.

[Manufacturing Method Description]

Then, with reference to FIGS. 16 to 19, a method for manufacturing the semiconductor laser of the present embodiment will be described, and the configuration of the semiconductor laser will be made clearer. FIGS. 16 to 19 are each a cross sectional view showing the semiconductor laser of the present embodiment during a manufacturing step.

Figure 16:
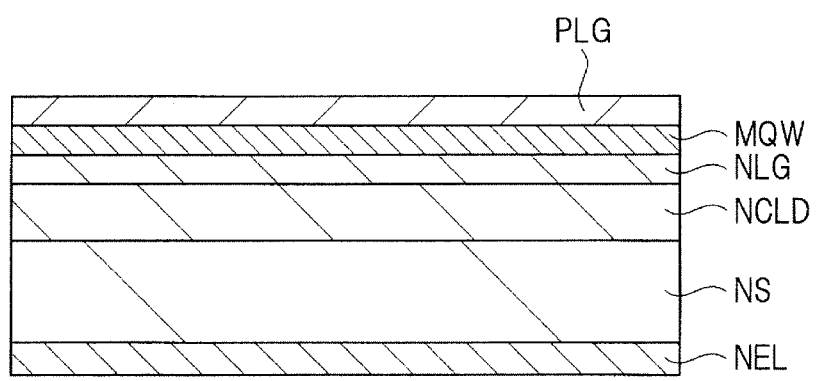
FIG. 16 is a cross sectional view showing the semiconductor laser of Second Embodiment during a manufacturing step.

As shown in FIG. 16, as an n type substrate NS, there is provided an n type GaN substrate. Thereover, as an n type cladding layer NCLD, an n type AlGaN layer is deposited. Sequentially, as an n type optical guide layer NLG, there is deposited an n type GaN layer. The layers are formed in the same manner as in First Embodiment.

Then, over the n type optical guide layer NLG, an active layer MQW (a multiple quantum well structure in which InGaN well layers and InGaN barrier layers different in indium composition are alternately stacked) is crystallinically grown.

Namely, as with First Embodiment, the raw material gas is switched. Thus, the active layer MQW (the multiple quantum well structure in which InGaN well layers and InGaN barrier layers different in indium composition are alternately stacked) is crystallinically grown.

Further, over the active layer MQW, as with First Embodiment, the p type optical guide layer PLG (p type GaN layer) is crystallinically grown.

Then, the raw material gas is switched. Thus, the p type barrier layer PBA (p type AlGaN layer) is crystallinically grown. For deposition of the p type barrier layer PBA (p type AlGaN layer), TMAl (trimethylaluminum), TMGa (trimethylgallium), and $NH_3$ (ammonia) are used as Al, Ga and N raw materials, respectively. As the raw material for the p type impurity, there is used $Cp_2Mg$ (bis(cyclopentadienyl)magnesium). The growth temperature herein is, for example, about 1100° C.

Figure 17:
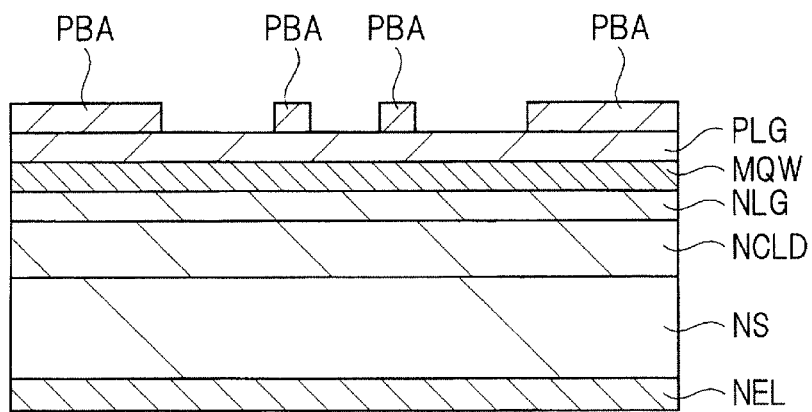
FIG. 17 is a cross sectional view showing the semiconductor laser of Second Embodiment during a manufacturing step following FIG. 16.

Then, as shown in FIG. 17, the p type barrier layer PBA (p type AlGaN layer) is patterned. For example, a hard mask (not shown) over the p type barrier layer PBA (p type AlGaN layer) is formed only in the region in which the p type barrier layer PBA is left. Then, with the hard mask (e.g., a silicon oxide film) as a mask, the p type barrier layer PBA (p type AlGaN layer) is etched. As the etching method, there is used a dry etching method.

Herein, in the formation region of a ridge stripe part described later (the lamination part of the p type cladding layer PCLD and the p type contact layer PCNT) (broken line of FIG. 6), the p type barrier layer PBA is partially arranged. For example, the plan configuration of the p type barrier layer PBA (p type AlGaN layer) as seen from the top surface thereof is, for example, a generally rectangular shape (the same as that of the current block layer BL of FIG. 6. See FIG. 6). For example, the lines of the p type barrier layers PBA arranged at a given interval in the Y direction are arranged in two columns. (See FIG. 6). Then, on the opposite sides of the formation region of the ridge stripe part (broken line of FIG. 6), there is left the p type barrier layer PBA (p type AlGaN layer) (FIG. 17). From between the p type barrier layers PBA (p type AlGaN layers), the p type optical guide layer PLG (p type GaN layer) is exposed. Then, the hard mask is removed.

Figure 18:
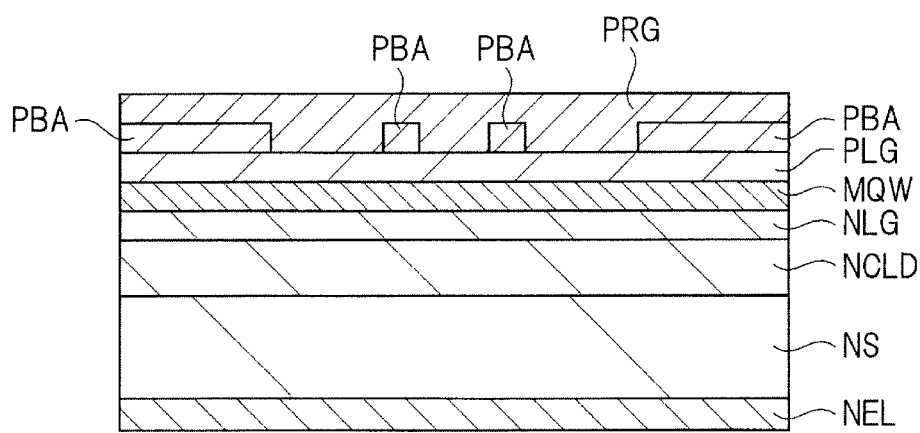
FIG. 18 is a cross sectional view showing the semiconductor laser of Second Embodiment during a manufacturing step following FIG. 17.

Then, as shown in FIG. 18, over the p type barrier layers PBA (p type AlGaN layers) and the p type optical guide layer PLG (p type GaN layer), a p type GaN layer is deposited as a p type regrowth layer PRG. For example, the p type GaN layer is deposited in the same manner as in First Embodiment.

Figure 19:
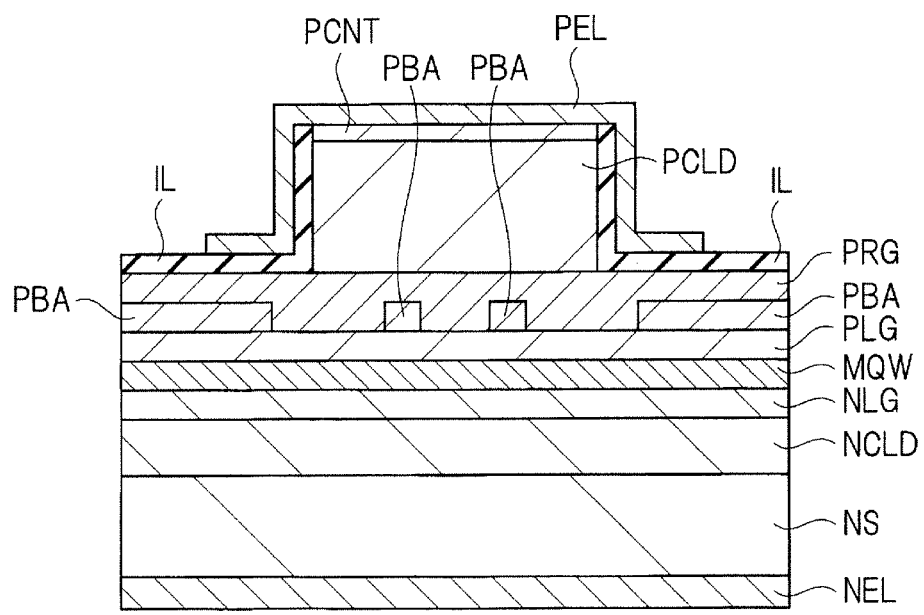
FIG. 19 is a cross sectional view showing the semiconductor laser of Second Embodiment during a manufacturing step following FIG. 18.

Then, as shown in FIG. 19, in the same manner as in First Embodiment, over the p type regrowth layer PRG, the p type cladding layer PCLD (p type AlGaN) and the p type contact layer PCNT (p type GaN layer) are crystallinically grown. The layers are patterned, thereby to form a ridge stripe part.

Then, in the same manner as in First Embodiment, over the ridge stripe part (the lamination part of the p type cladding layer PCLD and the p type contact layer PCNT) and the p type regrowth layer PRG (p type GaN layer), there is formed an insulation layer IL. Then, the insulation layer IL at the top surface of the ridge stripe part is removed. Thereafter, in the same manner as in First Embodiment, over the ridge stripe part (the lamination part of the p type cladding layer PCLD and the p type contact layer PCNT) and the insulation layer IL, there is formed a p side electrode PEL. Further, the back surface of the n type substrate NS is polished, so that the n type substrate NS is formed into a thin film. Then, an n side electrode NEL is formed (FIG. 19).

By the steps up to this point, it is possible to form the semiconductor laser of the present embodiment (see FIG. 15).

Thus, also in the present embodiment, the p type barrier layer PBA prevents a current from being injected into a part of the active layer MQW. For this reason, it is possible to manufacture a self-pulsation type semiconductor laser in which the portion serves as a saturable absorbing region. Further, the p type barrier layer PBA which is a layer having a large band gap is used to form the saturable absorbing region SA. For this reason, by simpler steps than those in the case of First Embodiment, the self-pulsation type semiconductor laser can be manufactured.

Incidentally, in the present embodiment, the lines of the p type barrier layers PBA in which the p type barrier layers PBA each in a generally rectangular shape are arranged at a given interval in the Y direction are arranged in two columns. However, as shown in FIGS. 14A and 14B, for example, the p type barrier layer PBA in a generally circular shape may be used. Alternatively, the p type barrier layer PBA may be formed in a ladder shape.

Figure 20:
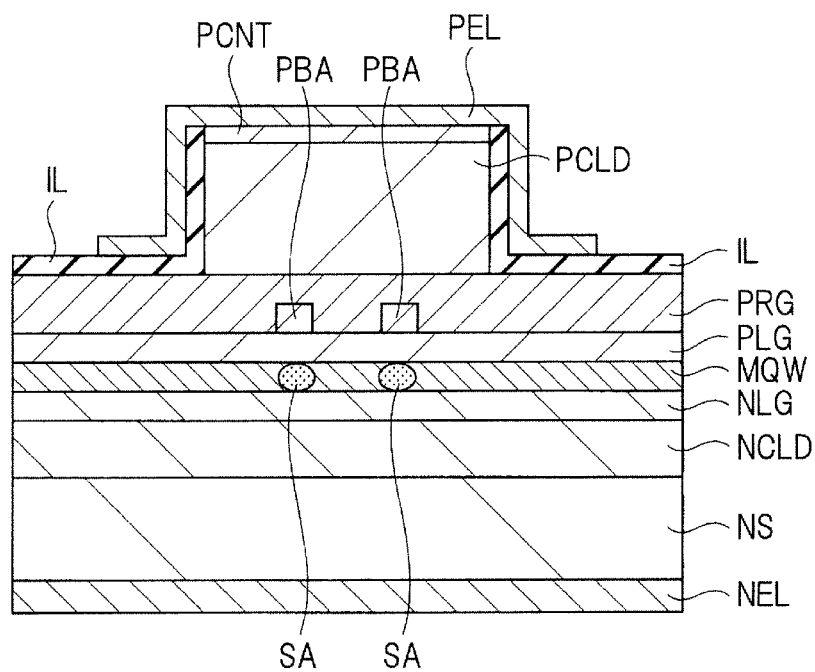
FIG. 20 is a cross sectional view showing another configuration of the semiconductor laser of Second Embodiment.

Further, in the present embodiment, there was left the p type barrier layer PBA on the opposite sides of the overlapping region of the p type cladding layer PCLD and the active layer MQW. However, the p type barrier layer PBA may be removed. FIG. 20 is a cross sectional view showing another configuration of the semiconductor laser of the present embodiment. As shown in FIG. 20, the following is also acceptable: there are removed the portions of the p type barrier layer PBA on the opposite sides of the overlapping region of the p type cladding layer PCLD and the active layer MQW; thus, the p type barrier layer PBA is arranged partially only in the overlapping region of the p type cladding layer PCLD and the active layer MQW. The p type barrier layer PBA has a role of confining electrons overflowed from the active layer MQW. For this reason, on the opposite sides of the overlapping region of the p type cladding layer PCLD and the active layer MQW, the p type barrier layer PBA is not required, and may be removed without a problem.

Further, in the overlapping region of the p type cladding layer PCLD and the active layer MQW, the p type barrier layer PBA is partially removed, resulting in reduction of the electron confining function. However, in operating environment at 70° C. or less, the overflow amount from the active layer MQW is small. For this reason, the semiconductor laser with the configuration of the present embodiment is preferably used.

Third Embodiment

Figure 21:
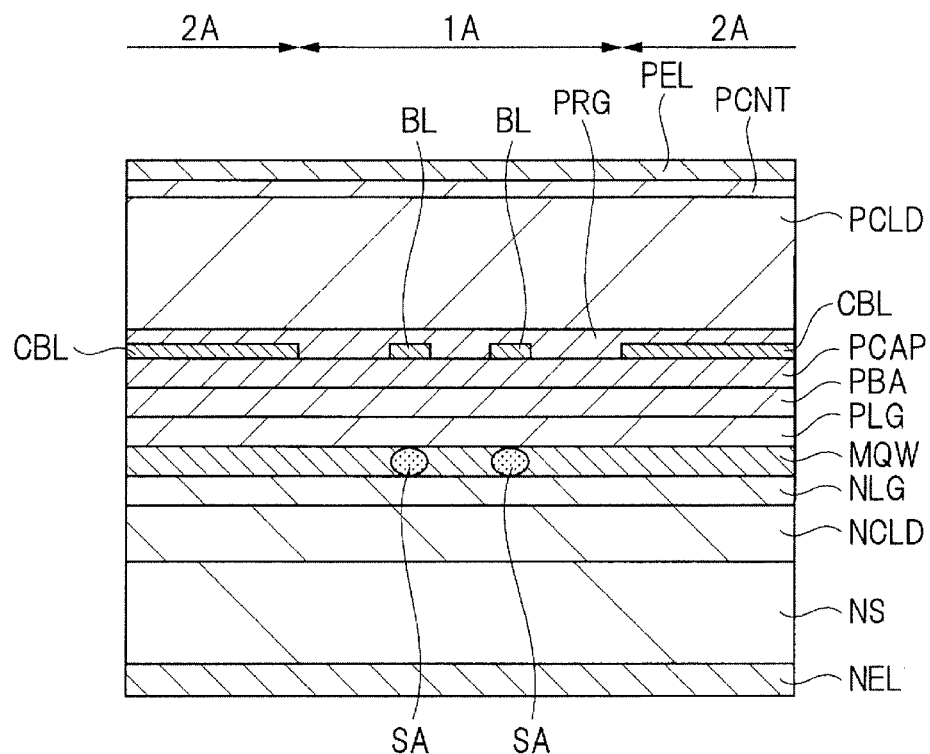
FIG. 21 is a cross sectional view showing a configuration of a semiconductor laser of Third Embodiment.

Below, with reference to the accompanying drawings, the semiconductor laser (semiconductor device) of the present embodiment will be described in details. FIG. 21 is a cross sectional view showing a configuration of the semiconductor laser of the present embodiment. Incidentally, the same parts as those of First Embodiment are given the same reference numerals and signs, and a detailed description thereon is omitted.

[Structure Description]

As shown in FIG. 21, the semiconductor laser of the present embodiment is not a semiconductor laser of the ridge structure described in First and Second Embodiments, but a semiconductor laser of a planar structure. Below, a detailed description will be given.

As with First Embodiment, the semiconductor laser of the present embodiment uses an n type substrate NS as a substrate, and has a plurality of nitride semiconductor layers sequentially stacked thereover. Specifically, as with First Embodiment, over the n type substrate NS, an n type cladding layer NCLD, an n type optical guide layer NLG, and an active layer MQW are arranged sequentially from the bottom. As the constituent materials for the layers, there may be used the same materials as those of First Embodiment.

Then, over the active layer MQW, a p type optical guide layer PLG, a p type barrier layer PBA, and a p type cap layer PCAP are arranged sequentially from the bottom. As the constituent materials for the layers, there may be used the same materials as those of First Embodiment.

Further, over the p type cap layer PCAP, there are arranged current block layers BL and CBL. As the constituent materials for the layers, there may be used the same materials as those for the current block layer BL of First Embodiment.

Herein, in the semiconductor laser of the present embodiment, while being arranged partially in the region 1A (about 1.4 µm in width), the current block layer BL is also further arranged on the opposite sides of the region 1A. Herein, the current block layer arranged on each opposite side of the region 1A is indicated with "CBL".

Thus, the current block layer BL is arranged partially in the region 1A. Further, each region 2A on each opposite side of the region 1A is covered with the current block layer CBL.

For example, the plan configuration of the current block layer BL as seen from the top surface thereof is a generally rectangular shape (see FIG. 6). For example, the lines of the current block layers BL arranged at a given interval in the Y direction are arranged in two columns (see FIG. 6). From between the current block layers BL, the p type cap layer PCAP is exposed.

As described in details in First Embodiment, the current block layer BL is formed of a nitride semiconductor, and is larger in band gap than any of the active layer MQW, the n type cladding layer NCLD, and the p type cladding layer PCLD. More particularly, the current block layer BL is larger in band gap than any layer of the active layer MQW, the lamination part of the p type nitride semiconductors thereover, and the lamination part of the n type nitride semiconductors thereunder.

Further, the current block layer CBL is arranged on each opposite side (region 2A) of the region 1A. For example, the current block layer CBL is arranged in such a manner as to cover each opposite side of the region 1A. The current block layer CBL is, as with the current block layer BL, formed of a nitride semiconductor, and is larger in band gap than any of the active layer MQW, the n type cladding layer NCLD, and the p type cladding layer PCLD. More particularly, the current block layer CBL is larger in band gap than any layer of the active layer MQW, the lamination part of p type nitride semiconductors thereover, and the lamination part of n type nitride semiconductors thereunder.

For this reason, even when the ridge stripe part formed of the p type contact layer PCNT and the p type cladding layer PCLD is not provided, the current block layer CBL restricts the region of a forward current flowing from the p side electrode PEL toward the n side electrode NEL. The region between the current block layers CBL, namely, the region 1A serves as a current narrowing region.

On the other hand, the current block layers BL are arranged partially in the region 1A. For this reason, as with First Embodiment, a saturable absorbing region SA is formed. This enables the optical output to self-pulsate.

Over the p type cap layer PCAP and the current block layers BL and CBL, as with First Embodiment, there is arranged the p type regrowth layer PRG. Then, over the p type regrowth layer PRG, there are arranged the p type cladding layer PCLD and the p type contact layer PCNT. As the constituent materials for the layers, there may be used the same materials as those of First Embodiment.

Thus, the p type contact layer PCNT and the p type cladding layer PCLD over the p type regrowth layer PRG are not patterned, and are in a planar structure.

Then, over the p type contact layer PCNT at the uppermost layer, there is arranged a p side electrode PEL. At the back surface of the n type substrate NS, there is arranged an n side electrode NEL.

Herein, also in the present embodiment, as with First Embodiment, the current block layers BL are arranged partially in the region 1A. This inhibits the current flowing from the p side electrode PEL to the current narrowing region (region 1A) defined between the current block layers CBL. Accordingly, the saturable absorbing region SA is generated, so that the intensity of a laser light self-pulsates. Therefore, the same effects as those of First Embodiment are exerted.

Further, it is not necessary to form the ridge stripe part (the p type cladding layer PCLD and the p type contact layer PCNT) as with First Embodiment. This results in an increase in contact area between the p type contact layer PCNT and the p side electrode PEL. For this reason, it is possible to reduce the contact resistance between the p type contact layer PCNT and the p side electrode PEL. This can improve the characteristics of the semiconductor laser. Further, it is possible to ensure a wide current injection path for the p type cladding layer PCLD. For this reason, the element resistance can be reduced as compared with the structures of First Embodiment and Second Embodiment. As a result, it is possible to implement a self-pulsation type nitride type semiconductor laser capable of a low-voltage operation.

[Manufacturing Method Description]

Figure 22:
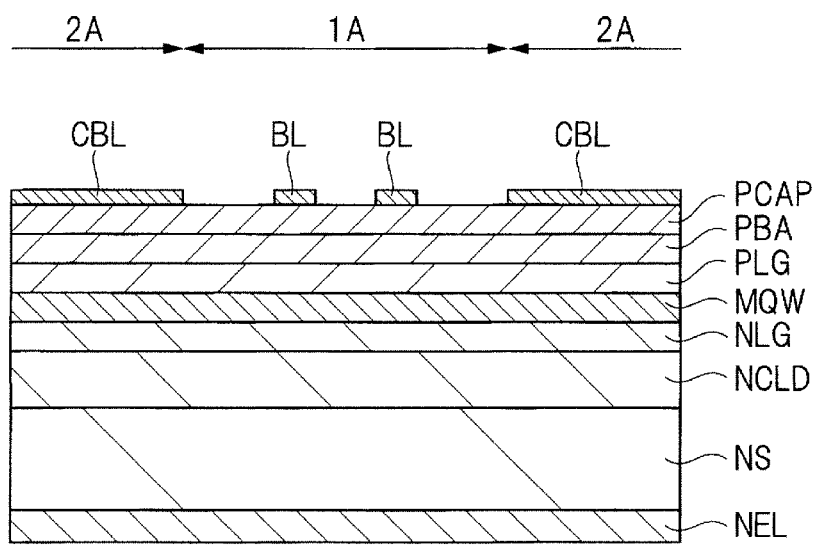
FIG. 22 is a cross sectional view showing the semiconductor laser of Third Embodiment during a manufacturing step.
Figure 23:
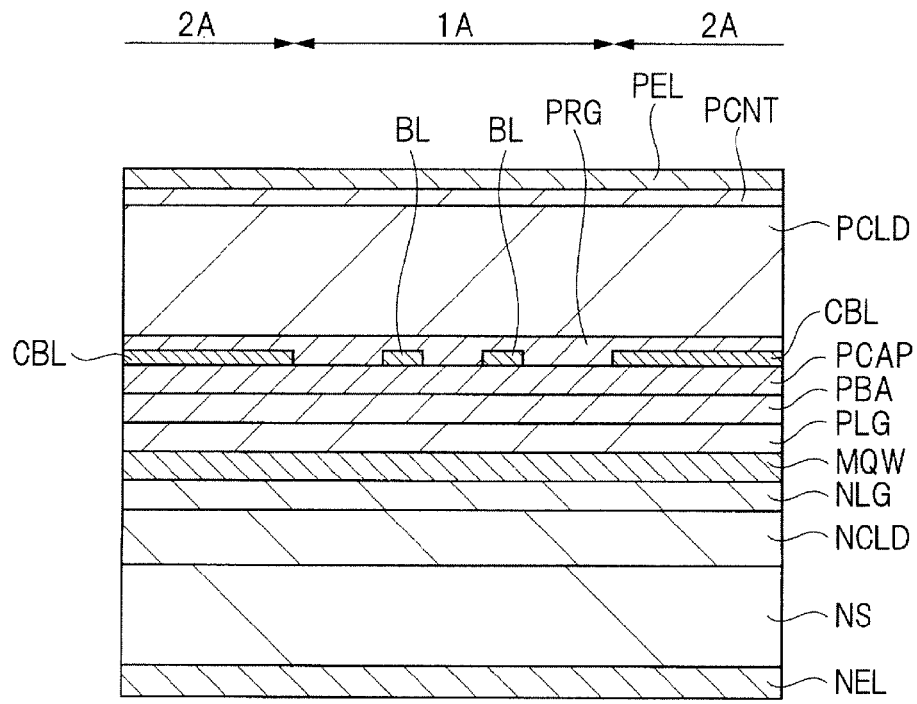
FIG. 23 is a cross sectional view showing the semiconductor laser of Third Embodiment during a manufacturing step following FIG. 22.
Figure 24:
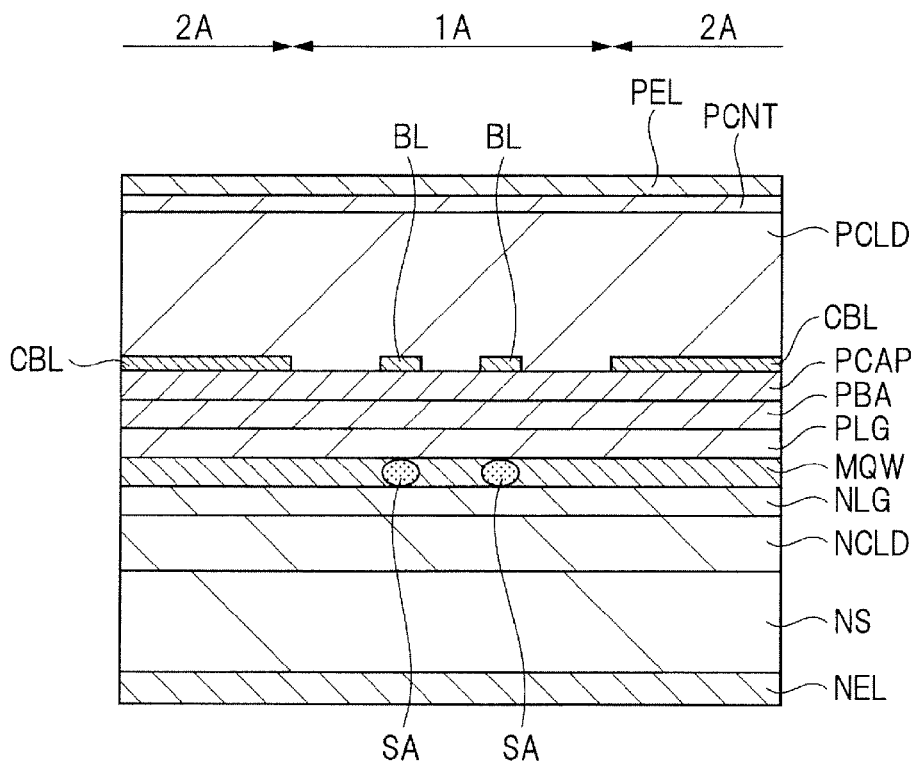
FIG. 24 is a cross sectional view showing another configuration of the semiconductor laser of Third Embodiment.

Then, with reference to FIGS. 22 to 24, a method for manufacturing the semiconductor laser of the present embodiment will be described, and the configuration of the semiconductor laser will be made clearer. FIGS. 22 to 24 are each a cross sectional view showing the semiconductor laser of the present embodiment during a manufacturing step.

As shown in FIG. 22, as an n type substrate NS, there is provided an n type GaN substrate. Thereover, as an n type cladding layer NCLD, an n type AlGaN layer is deposited. Sequentially, as an n type optical guide layer NLG, there is deposited an n type GaN layer. The layers are formed in the same manner as in First Embodiment.

Then, over the n type optical guide layer NLG, an active layer MQW (a multiple quantum well structure in which InGaN well layers and InGaN barrier layers different in indium composition are alternately stacked) is crystallinically grown as with First Embodiment.

Further, over the active layer MQW, as with First Embodiment, there are sequentially crystallinically grown a p type optical guide layer PLG (p type GaN layer), a p type barrier layer PBA (p type AlGaN layer), and a p type cap layer PCAP (p type GaN layer).

Then, as with First Embodiment, over the p type cap layer PCAP (p type GaN layer), a current block layer BL (AlN layer) is crystallinically grown. Then, the current block layer BL (AlN layer) is patterned. The plan configuration of the current block layer BL (AlN layer) arranged in the region 1A as seen from the top surface thereof is, for example, a generally rectangular shape (see FIG. 6). For example, the lines of the current block layers BL arranged at a given interval in the Y direction are arranged in two columns (see FIG. 6). Then, the current block layers CBL (AlN layers) are left in such a manner as to cover the opposite sides of the region 1A (corresponding to the broken line part of FIG. 6) (FIG. 22). From between the current block layers BL (AlN layers), there is exposed the p type cap layer PCAP (p type GaN layer).

Then, as shown in FIG. 23, over the current block layers (AlN layers) BL and CBL, and the p type cap layer PCAP (p type GaN layer), a p type GaN layer is deposited as a p type regrowth layer PRG. For example, the p type GaN layer is deposited in the same manner as in First Embodiment.

Then, in the same manner as in First Embodiment, over the p type regrowth layer PRG, there are crystallinically grown a p type cladding layer PCLD (p type AlGaN) and a p type contact layer PCNT (p type GaN layer).

Thereafter, in the same manner as in First Embodiment, over the p type contact layer PCNT (p type GaN layer), there is formed a p side electrode PEL. Further, the back surface of the n type substrate NS is polished, so that the n type substrate NS is formed into a thin film. Then, an n side electrode NEL is formed (FIG. 23).

By the steps up to this point, it is possible to form the semiconductor laser (semiconductor device) of the present embodiment (see FIG. 21).

Thus, also in the present embodiment, the current block layer BL prevents a current from being injected into a part of the active layer MQW. For this reason, it is possible to manufacture a self-pulsation type semiconductor laser in which the portion serves as a saturable absorbing region. Further, the current block layer CBL which is a layer having a large band gap is used to form the saturable absorbing region SA. For this reason, it is not necessary to provide a ridge stripe part (the lamination part of the p type cladding layer PCLD and the p type contact layer PCNT). Thus, by simpler steps, the self-pulsation type semiconductor laser can be manufactured. Further, the ridge stripe part is not required to be formed. This results in an increase in contact area between the p type contact layer PCNT and the p side electrode PEL. For this reason, it is possible to reduce the contact resistance between the p type contact layer PCNT and the p side electrode PEL. This can improve the characteristics of the semiconductor laser.

Incidentally, in the present embodiment, over the current block layers (AlN layers) BL and CBL, and the p type cap layer PCAP (p type GaN layer), there was provided the p type regrowth layer PRG. However, the layer may be omitted. FIG. 24 is a cross sectional view showing another configuration of the semiconductor laser of the present embodiment. As shown in FIG. 24, over the current block layers (AlN layers) BL and CBL, and the p type cap layer PCAP (p type GaN layer), there may be arranged a p type cladding layer PCLD (p type AlGaN).

Applied Example

The semiconductor laser described in the embodiment has no restriction on its applicable range, but is applicable to, for example, an optical disc device. The optical disc device is a device for reading information from optical discs such as a CD (compact disc) and a DVD (digital versatile disc). The read operation of a signal recorded on an optical disc is performed by an optical pick-up. The optical pick-up has a light source and a light receptive part for performing reading of data of an optical disc. As a light source for the optical pick-up, a semiconductor laser can be used. When the semiconductor laser is used as a light source, the light reflected by the optical disc, and returning to the semiconductor laser, a so-called feedback light becomes a problem. Namely, the feedback light causes a disturbance in the oscillation state in the semiconductor laser, thereby to generate a noise. This causes a data reading error. Thus, as the light source of the optical pick-up for use in an optical disc device, the semiconductor layer described in the embodiment is used. As a result, a feedback light-induced noise can be reduced by a self-pulsation operation. Namely, the self-pulsation operation reduces the coherence of a laser light, thereby to suppress the disturbance of the semiconductor laser due to a feedback light. This enables reading of data from an optical disc with precision.

Up to this point, the present invention completed by the present inventors was particularly described by way of embodiments. However, it is naturally understood that the present invention is not limited to the embodiment, and may be variously changed within the scope not departing from the gist thereof.

For example, in the First to Third Embodiments, a description has been given to the cases of a semiconductor laser (violet color) using a nitride semiconductor of III-V group compound semiconductors. However, the First to Third Embodiments are applicable to semiconductor lasers using other III-V group compound semiconductors. For example, the First to Third Embodiments are also applicable to AlGaInP type red lasers, and long-wavelength region semiconductor lasers (InGaAsP type and AlInGaAs type). In that case, as the semiconductors for use as the current block layer, there may be used AlGaInP and AlInP with a high Al composition for the case of the AlGaInP type, and AlGaInAs and AlInAs with a high Al composition for the case of the long-wavelength region.

[Additional Statement 1]

A semiconductor device having a first III-V group compound semiconductor layer; a second III-V group compound semiconductor layer arranged over the first III-V group compound semiconductor layer; a third III-V group compound semiconductor layer arranged over the second III-V group compound semiconductor layer, and in a part of a formation region of the second III-V group compound semiconductor layer; and a fourth III-V group compound semiconductor layer arranged between the third III-V group compound semiconductor layer and the second III-V group compound semiconductor layer, and partially in an overlapping region of the third III-V group compound semiconductor layer and the second III-V group compound semiconductor layer, wherein the first III-V group compound semiconductor layer is larger in band gap than the second III-V group compound semiconductor layer, and is of a first conductivity type, wherein the third III-V group compound semiconductor layer is larger in band gap than the second III-V group compound semiconductor layer, and is of a second conductivity type which is the opposite conductivity type to the first conductivity type, and wherein the fourth III-V group compound semiconductor layer is larger in band gap than the third III-V group compound semiconductor layer.

[Additional Statement 2]

A semiconductor device having a first III-V group compound semiconductor layer; a second III-V group compound semiconductor layer arranged over the first III-V group compound semiconductor layer; a third III-V group compound semiconductor layer arranged over the second III-V group compound semiconductor layer; and a first film and a second film arranged between the third III-V group compound semiconductor layer and the second III-V group compound semiconductor layer, and formed of a fourth III-V group compound semiconductor layer, wherein the first film is arranged partially in a first region, wherein the second film is arranged in a second region situated on each opposite side of the first region, wherein the first III-V group compound semiconductor layer is larger in band gap than the second III-V group compound semiconductor layer, and is of a first conductivity type, wherein the third III-V group compound semiconductor layer is larger in band gap than the second III-V group compound semiconductor layer, and is of a second conductivity type which is the opposite conductivity type to the first conductivity type, and wherein the fourth III-V group compound semiconductor layer is larger in band gap than the third III-V group compound semiconductor layer.

What is claimed is:

1. A semiconductor device, comprising:
   a first nitride semiconductor layer;
   a second nitride semiconductor layer arranged over the first nitride semiconductor layer;
   a third nitride semiconductor layer arranged over the second nitride semiconductor layer, and in a part of a formation region of the second nitride semiconductor layer; and
   a fourth nitride semiconductor layer arranged between the third nitride semiconductor layer and the second nitride semiconductor layer, and partially in an overlapping region of the third nitride semiconductor layer and the second nitride semiconductor layer,
   wherein the first nitride semiconductor layer is larger in band gap than the second nitride semiconductor layer, and is of a first conductivity type,
   wherein the third nitride semiconductor layer is larger in band gap than the second nitride semiconductor layer, and is of a second conductivity type which is the opposite conductivity type to the first conductivity type, and wherein the fourth nitride semiconductor layer is larger in band gap than the third nitride semiconductor layer.

2. The semiconductor device according to claim 1, comprising a fifth nitride semiconductor layer arranged between the second nitride semiconductor layer and the fourth nitride semiconductor layer, wherein the fourth nitride semiconductor layer is arranged over the fifth nitride semiconductor layer.

3. The semiconductor device according to claim 2, comprising a sixth nitride semiconductor layer arranged under the fifth nitride semiconductor layer.

4. The semiconductor device according to claim 1, comprising a seventh nitride semiconductor layer arranged between the fourth nitride semiconductor layer and the third nitride semiconductor layer, wherein the third nitride semiconductor layer is arranged over the seventh nitride semiconductor layer.

5. The semiconductor device according to claim 1, wherein a plurality of the fourth nitride semiconductor layers are arranged in an overlapping region of the third nitride semiconductor layer and the second nitride semiconductor layer.

6. The semiconductor device according to claim 5, wherein the fourth nitride semiconductor layers are arranged each at an interval of a first distance.

7. The semiconductor device according to claim 5, wherein a plan configuration of the fourth nitride semiconductor layer is a circular shape or a tetragonal shape.

8. The semiconductor device according to claim 1, wherein the fourth nitride semiconductor layer has a plurality of openings.

9. The semiconductor device according to claim 1, wherein the first nitride semiconductor layer is an aluminum gallium nitride layer doped with an n type impurity, wherein the second nitride semiconductor layer is a lamination including alternately stacked first indium gallium nitride layers and second indium gallium nitride layers different in indium composition, wherein the third nitride semiconductor layer is an aluminum gallium nitride layer doped with a p type impurity, and wherein the fourth nitride semiconductor layer is an aluminum nitride layer or an aluminum gallium nitride layer doped with a p type impurity.

10. The semiconductor device according to claim 2, wherein the fifth nitride semiconductor layer is a gallium nitride layer doped with a p type impurity.

11. The semiconductor device according to claim 3, wherein the sixth nitride semiconductor layer is an aluminum gallium nitride layer doped with a p type impurity.

12. The semiconductor device according to claim 4, wherein the seventh nitride semiconductor layer is a gallium nitride layer doped with a p type impurity.

13. The semiconductor device according to claim 1, wherein the plan configuration of the third nitride semiconductor layer is a line shape.

14. A semiconductor device, comprising:

a first nitride semiconductor layer;

a second nitride semiconductor layer arranged over the first nitride semiconductor layer;

a third nitride semiconductor layer arranged over the second nitride semiconductor layer, and in a part of a formation region of the second nitride semiconductor layer; and a fourth nitride semiconductor layer arranged between the third nitride semiconductor layer and the second nitride semiconductor layer, and partially in an overlapping region of the third nitride semiconductor layer and the second nitride semiconductor layer, wherein the first nitride semiconductor layer is larger in band gap than the second nitride semiconductor layer, and is of a first conductivity type, wherein the third nitride semiconductor layer is larger in band gap than the second nitride semiconductor layer, and is of a second conductivity type which is the opposite conductivity type to the first conductivity type, wherein the fourth nitride semiconductor layer is larger in band gap than the third nitride semiconductor layer, wherein an overlapping region of the third nitride semiconductor layer and the second nitride semiconductor layer is in a line shape, and wherein the fourth nitride semiconductor layer is also arranged on each opposite side of the overlapping region.

15. A semiconductor device, comprising:

a first nitride semiconductor layer;

a second nitride semiconductor layer arranged over the first nitride semiconductor layer;

a third nitride semiconductor layer arranged over the second nitride semiconductor layer; and a first film and a second film arranged between the third nitride semiconductor layer and the second nitride semiconductor layer, and formed of a fourth nitride semiconductor layer, wherein the first film is arranged partially in a first region, wherein the second film is arranged in a second region situated on each opposite side of the first region, wherein the first nitride semiconductor layer is larger in band gap than the second nitride semiconductor layer, and is of a first conductivity type, wherein the third nitride semiconductor layer is larger in band gap than the second nitride semiconductor layer, and is of a second conductivity type which is the opposite conductivity type to the first conductivity type, and wherein the fourth nitride semiconductor layer is larger in band gap than the third nitride semiconductor layer.

16. The semiconductor device according to claim 15, comprising a fifth nitride semiconductor layer arranged between the second nitride semiconductor layer and the fourth nitride semiconductor layer, wherein the fourth nitride semiconductor layer is arranged over the fifth nitride semiconductor layer.

17. The semiconductor device according to claim 16, comprising a sixth nitride semiconductor layer arranged under the fifth nitride semiconductor layer.

18. The semiconductor device according to claim 15, comprising a seventh nitride semiconductor layer arranged between the fourth nitride semiconductor layer and the third nitride semiconductor layer, wherein the third nitride semiconductor layer is arranged over the seventh nitride semiconductor layer.

19. The semiconductor device according to claim 15, wherein the first nitride semiconductor layer is an aluminum gallium nitride layer doped with an n type impurity, wherein the second nitride semiconductor layer is a lamination including alternately stacked first indium gallium nitride layers and second indium gallium nitride layers different in indium composition, wherein the third nitride semiconductor layer is an aluminum gallium nitride layer doped with a p type impurity, and wherein the fourth nitride semiconductor layer is an aluminum nitride layer.

20. The semiconductor device according to claim 17, wherein the fifth nitride semiconductor layer is a gallium nitride layer doped with a p type impurity, and
wherein the sixth nitride semiconductor layer is an aluminum gallium nitride layer doped with a p type impurity.

21. The semiconductor device according to claim 18, wherein the seventh nitride semiconductor layer is a gallium nitride layer doped with a p type impurity.

* * * * *